(12) United States Patent
Smith et al.

(10) Patent No.: US 8,686,804 B2
(45) Date of Patent: Apr. 1, 2014

(54) ORTHOGONALLY REFERENCED INTEGRATED ENSEMBLE FOR NAVIGATION AND TIMING

(71) Applicant: UT-Batelle, LLC, Oak Ridge, TN (US)

(72) Inventors: Stephen Fulton Smith, Loudon, TN (US); James Anthony Moore, Powell, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 0 days.

(21) Appl. No.: 13/745,438

(22) Filed: Jan. 18, 2013

(65) Prior Publication Data

US 2013/0141172 A1 Jun. 6, 2013

Related U.S. Application Data

(62) Division of application No. 13/083,366, filed on Apr. 8, 2011, now Pat. No. 8,384,487.

(51) Int. Cl.
*H03L 7/22* (2006.01)

(52) U.S. Cl.
USPC .................................. 331/162; 331/2; 331/46

(58) Field of Classification Search
USPC ................................................ 331/162, 2, 46
See application file for complete search history.

(56) References Cited

U.S. PATENT DOCUMENTS

| | | |
|---|---|---|
| 3,372,395 A | 3/1968 | Kline |
| 4,550,292 A | 10/1985 | Smith |
| 4,575,689 A | 3/1986 | Valentin |
| 4,601,206 A * | 7/1986 | Watson ........................... 73/510 |
| 4,872,765 A | 10/1989 | Schodowski |
| 5,212,715 A | 5/1993 | Pickert et al. |
| 5,402,348 A | 3/1995 | De La Salle et al. |
| 5,668,775 A | 9/1997 | Hatteland |
| 5,781,073 A | 7/1998 | Mii |

(Continued)

FOREIGN PATENT DOCUMENTS

| | | |
|---|---|---|
| JP | 2180410 A | 7/1990 |
| JP | 4018805 A | 1/1992 |

(Continued)

OTHER PUBLICATIONS

Buckner, Mark A.; "Learning from Data with Localized Regression and Differential Evolution"; Dissertation, The University of Tennessee, Knoxville, Tennessee; May 2003; pp. 1-183.

(Continued)

*Primary Examiner* — Joseph Chang
(74) *Attorney, Agent, or Firm* — Brinks Gilson & Lione

(57) ABSTRACT

An orthogonally referenced integrated ensemble for navigation and timing includes a dual-polyhedral oscillator array, including an outer sensing array of oscillators and an inner clock array of oscillators situated inside the outer sensing array. The outer sensing array includes a first pair of sensing oscillators situated along a first axis of the outer sensing array, a second pair of sensing oscillators situated along a second axis of the outer sensing array, and a third pair of sensing oscillators situated along a third axis of the outer sensing array. The inner clock array of oscillators includes a first pair of clock oscillators situated along a first axis of the inner clock array, a second pair of clock oscillators situated along a second axis of the inner clock array, and a third pair of clock oscillators situated along a third axis of the inner clock array.

6 Claims, 16 Drawing Sheets

(56) References Cited

U.S. PATENT DOCUMENTS

| | | | |
|---|---|---|---|
| 5,796,366 | A | 8/1998 | Grebnev et al. |
| 6,281,761 | B1 | 8/2001 | Shin et al. |
| 6,308,077 | B1 | 10/2001 | Walsh |
| 6,466,200 | B1 | 10/2002 | Anton et al. |
| 6,539,306 | B2 | 3/2003 | Turnbull |
| 6,556,942 | B1 | 4/2003 | Smith |
| 6,693,511 | B1 | 2/2004 | Seal |
| 6,707,346 | B2 | 3/2004 | Tillotson et al. |
| 6,907,346 | B2 | 6/2005 | Teranishi et al. |
| 6,925,135 | B2 | 8/2005 | Smith et al. |
| 6,933,788 | B2 | 8/2005 | Forrester et al. |
| 6,972,719 | B1 | 12/2005 | Swope et al. |
| 6,973,145 | B1 | 12/2005 | Smith et al. |
| 7,046,584 | B2 | 5/2006 | Sorrells et al. |
| 7,092,440 | B1 | 8/2006 | Dress, Jr. et al. |
| 7,154,937 | B2 | 12/2006 | Gilmour et al. |
| 7,245,215 | B2 | 7/2007 | Gollu et al. |
| 7,299,034 | B2 | 11/2007 | Kates |
| 7,394,381 | B2 | 7/2008 | Hanson et al. |
| 7,411,492 | B2 | 8/2008 | Greenberg |
| 7,459,984 | B2 | 12/2008 | Wang et al. |
| 7,468,694 | B2 | 12/2008 | Shoarinejad |
| 7,472,032 | B1 | 12/2008 | Allan et al. |
| 7,479,927 | B2 | 1/2009 | Scarpelli |
| 7,626,544 | B2 | 12/2009 | Smith et al. |
| 7,636,061 | B1 | 12/2009 | Thomas et al. |
| 7,656,931 | B2 | 2/2010 | Smith et al. |
| 7,660,338 | B2 | 2/2010 | Smith et al. |
| 7,840,352 | B2 | 11/2010 | Strelow et al. |
| 2002/0193946 | A1 | 12/2002 | Turnbull |
| 2003/0018430 | A1 | 1/2003 | Ladetto et al. |
| 2003/0119568 | A1 | 6/2003 | Menard |
| 2003/0122720 | A1 | 7/2003 | Matz et al. |
| 2003/0144795 | A1 | 7/2003 | Lin |
| 2004/0064252 | A1 | 4/2004 | Kirkland et al. |
| 2004/0236500 | A1 | 11/2004 | Choi et al. |
| 2006/0069469 | A1 | 3/2006 | Campbell et al. |
| 2006/0122775 | A1 | 6/2006 | Soehren |
| 2006/0192625 | A1 | 8/2006 | Sorrells et al. |
| 2006/0193373 | A1 | 8/2006 | Agee et al. |
| 2006/0240839 | A1 | 10/2006 | Chen et al. |
| 2006/0255934 | A1 | 11/2006 | Easley et al. |
| 2006/0287816 | A1 | 12/2006 | Bardsley et al. |
| 2007/0018811 | A1 | 1/2007 | Gollu |
| 2007/0073481 | A1 | 3/2007 | Morgan et al. |
| 2007/0211791 | A1 | 9/2007 | Ganguly et al. |
| 2007/0241828 | A1 | 10/2007 | Nakamura et al. |
| 2007/0241886 | A1 | 10/2007 | Breeding |
| 2007/0286028 | A1 | 12/2007 | Meltzer et al. |
| 2008/0004796 | A1 | 1/2008 | Schott et al. |
| 2008/0091350 | A1 | 4/2008 | Smith et al. |
| 2008/0129591 | A1 | 6/2008 | Lamance et al. |
| 2008/0140316 | A1 | 6/2008 | Masson |
| 2009/0278735 | A1 | 11/2009 | Jin et al. |

FOREIGN PATENT DOCUMENTS

| | | |
|---|---|---|
| JP | 6069568 A | 3/1994 |
| JP | 7312549 A | 11/1995 |
| JP | 10104015 A | 4/1998 |
| JP | 10261919 A | 9/1998 |
| JP | 2005039791 A | 2/2005 |

OTHER PUBLICATIONS

Dixon, Robert C.; "Spread Spectrum Systems with Commercial Applications"; John Wiley & Sons, Inc.; Third Edition; 1994; pp. 18-32, 85-112, 500-503.

Dostert, K.; "Frequency-Hopping Spread-Spectrum Modulation for Digital Communications over Electrical Power Lines"; IEEE; vol. 8, No. 4; May 1990; pp. 700-710.

Grewal, Mohinder S. et al.; "Global Positioning Systems, Inertial Navigation, and Integration"; John Wiley & Sons, Inc.; 2001; pp. 9-28.

Hutsell, Capt. S. T., "Relating the Hadamard Variance to MCS Kalman Filter Clock Estimation," 1995, pp. 291-301.

Kaplan, Elliot D., Editor; "Understanding GPS Principles sand Applications"; Artech House Inc.; 1996; pp. 39-52, 54.

Lo, Sherman C. et al.; "Broadcasting Data from an SBAS Reference Network over using LORAN"; Stanford University, Department of Aeronautics and Astronautics; http://wasas.stanford.edu/~wwu/sherman/IONIAIN2000.pdf; pp. 1-10; Jun. 2000.

Miguel, Edward K.; *Northern Illinois Univ De Kalb*; "A Temperature Compensated SC Cut Quartz Crystal Oscillator"; Abstract; 1982; retrieved from the internet on Sep. 9, 2011 at http://oai.dtic.mil/oai/oai?verb=getRecord&metadataPrefix=html&identifier=ADP001573.

Mroch, A.B. et al.; "High Stability Temperature Compensated Crystal Osciallator Study"; *The Smithsonian/NASA Astrophysics Data System;* Interim Progress Report; Feb. 28, 1974-Feb. 28, 1975; Rockwell International Corp.; Cedar Rapids, IA; Collins Radio Group; retrieved from the internet on Mar. 26, 2010 at http://adsabs.harvard.edu/abs/1976ric...reptR....M.

"Revolutionary New Navigation System Combines Multiple Technologies for Robustness, Reliability"; Frost & Sullivan; Technical Insights; Oct. 28, 2005; pp. 4.

"Streaming SIMD Extensions—Inverse of 4×4"; Intel Corporation; Mar. 1999; pp. 1-10.

Ueno, Yoshifusa; "Temperature-compensated crystal oscillator using a two-port crystal resonator"; Electronics and Communications in Japan, vol. 77, Issue 9; pp. 39-47; Mar. 2007.

van der Merwe, R. et al.; "Sigma-Point Kalman Filters for Probabilistic Inference in Dynamic State-Space Models"; Proceedings of the Workshop on Advances in Machine Learning; Montreal, Canada; Jun. 2003; 27 pages.

Vig, J.R. et al.; "Temperature Stable Oscillator"; *CSA Illumina;* IEEE Transactions on Ultrasonics, Ferroelectrics, and Frequency Control; vol. 42, No. 4; pp. 797-799; Jul. 1995.

Wang, Jia-bin et al.; "A Method for Realizing the Temperature-Compensated Crystal Oscillator"; *Journal of Huagiao University (Natural Science)* ; Apr. 2007; College of Information Science and Engineering, Huaqiao University, Quanzhou 362021 China; retrieved from the internet on Mar. 26, 2010 at http://en.cnki.com.cn/Article_en/CJFDTOTAL-HQDB200704012.htm.

* cited by examiner

ORTHOGONALLY REFERENCED INTEGRATED ENSEMBLE FOR NAVIGATION AND TIMING

PRIORITY CLAIM

This application is a divisional of U.S. application Ser. No. 13/083,366, filed Apr. 8, 2011, which is incorporated herein by reference.

FEDERALLY SPONSORED RESEARCH OR DEVELOPMENT

This invention described in this disclosure was made with government support under Prime Contract Number DE-AC05-000R22725 awarded by the Department of Energy. The government has certain rights in this invention.

BACKGROUND

1. Field of the Disclosure

This disclosure relates to an orthogonally referenced integrated ensemble for obtaining measurements for navigation and timing.

2. Description of the Related Art

Navigation systems have been developed to locate an object on the surface of the earth and to assist in navigating the object to a desired destination. Various means for locating the object have been developed, such as utilizing a global positioning system ("GPS"), an improved "theater" (or "terrestrial") positioning system ("TPS") which utilizes radio frequency signals transmitted to a local or regional area, and inertial navigation systems ("INSs") which utilize inertial sensors to supplement the GPS and/or TPS.

Navigation systems utilizing the three locating means GPS, TPS, and INS have been developed such that when one or more means become unreliable or otherwise not fit for accurately locating an object, the remaining locating means may be used. Such systems may include internal oscillators to keep precise timing for operating the GPS and TPS systems. Oscillators may also be used as inertial sensors for detecting relative motion in the INS system. However, oscillators having low acceleration or motion sensitivities suitable for precise time keeping are generally not suitable as inertial sensors used for INS systems. High-sensitivity oscillators are therefore preferred for INS systems.

Therefore, a need exists to address the problems noted above and others previously experienced.

SUMMARY

An orthogonally referenced integrated ensemble for navigation and timing ("ORIENT") includes a dual-polyhedral oscillator array, including an outer sensing array of oscillators and an inner clock array of oscillators deployed inside the outer sensing array. The outer sensing array includes a first pair of sensing oscillators situated along a first axis of the outer sensing array, a second pair of sensing oscillators situated along a second axis of the outer sensing array, and a third pair of sensing oscillators situated along a third axis of the outer sensing array. The inner clock array of oscillators includes a first pair of clock oscillators situated along a first axis of the inner clock array, a second pair of clock oscillators situated along a second axis of the inner clock array, and a third pair of clock oscillators situated along a third axis of the inner clock array. In an embodiment, the outer sensing array and the inner clock array each may be a cubic array. In another embodiment, the outer sensing array and the inner clock array each may be a dodecahedral array.

A dual-mode oscillator (DMO) includes a crystal operable to oscillate in a main or primary mode and in a secondary temperature-measurement mode, the crystal further operable to output an oscillation signal, a first circuit operable to separate a main signal of the main mode from the oscillation signal, a second circuit operable to separate a temperature-measurement signal of the temperature-measurement mode from the oscillation signal, and a signal processor coupled to the first circuit and the second circuit, the signal processor configured to generate an output signal. The temperature-measurement mode may be a fifth-overtone mode.

A differential oscillator includes a crystal operable to oscillate in a main mode and in a secondary mode, the crystal further operable to output an oscillation signal, a first circuit operable to separate a main signal of the main mode from the oscillation signal, and a second circuit operable to separate a secondary signal of the secondary mode from the oscillation signal. The first circuit and the second circuit are both disposed in a substantially symmetrical differential layout, and the first circuit and the second circuit each includes an automatic oscillator gain-control (AGC) loop coupled to the oscillator circuit.

A multi-mode oscillator includes a crystal operable to oscillate in a main mode, in a secondary mode and in a tertiary mode. The crystal oscillator may be further operable to output an oscillation signal. The multi-mode oscillator further includes a first circuit operable to separate a main signal of the main mode from the oscillation signal, a second circuit operable to separate a secondary signal of the secondary mode from the oscillation signal, a third circuit operable to separate a third signal of the tertiary mode from the oscillation signal, and a signal processor coupled to the first circuit, the second circuit and the third circuit. The signal processor is configured to generate a first output signal based on the main signal and the secondary signal in response to the secondary mode being stable, and generate a second output signal based on the main signal and the tertiary signal in response to the secondary mode being unstable or unreliable.

A method for reducing mode-jumping in a dual-mode oscillator includes driving a crystal operable to oscillate in two different modes in an oscillator loop, and modifying a signal in the oscillator loop to reduce mode-jumping.

An electronic automatic oscillator gain-control (AGC) circuit includes a balanced bridge network operable to regulate circuit gain, where the balanced bridge network includes a single-ended gain-control device operable to regulate the circuit gain while maintaining approximate balance in the balanced bridge network. In an embodiment, the electronic AGC circuit includes an electronically adjustable differential attenuator, which can have noise contributions from only one device. In another embodiment, the electronic AGC includes an electronically variable differential attenuator including only linear circuit elements. In yet another embodiment, the electronic AGC circuit includes an electronically variable differential attenuator having noise contributions from only one active device and fixed resistors.

DETAILED DESCRIPTION OF THE PREFERRED EMBODIMENTS

The Orthogonally Referenced Integrated Ensemble for Navigation and Timing ("ORIENT" system) configuration includes a dual-cubic oscillator array. The dual-cubic array may include an outer cubic array and an inner cubic array which may be disposed inside the outer cubic array. The outer cubic array may be configured to be used as inertial sensors, and the inner cubic array may be configured to be used for measuring time.

Figure 1:
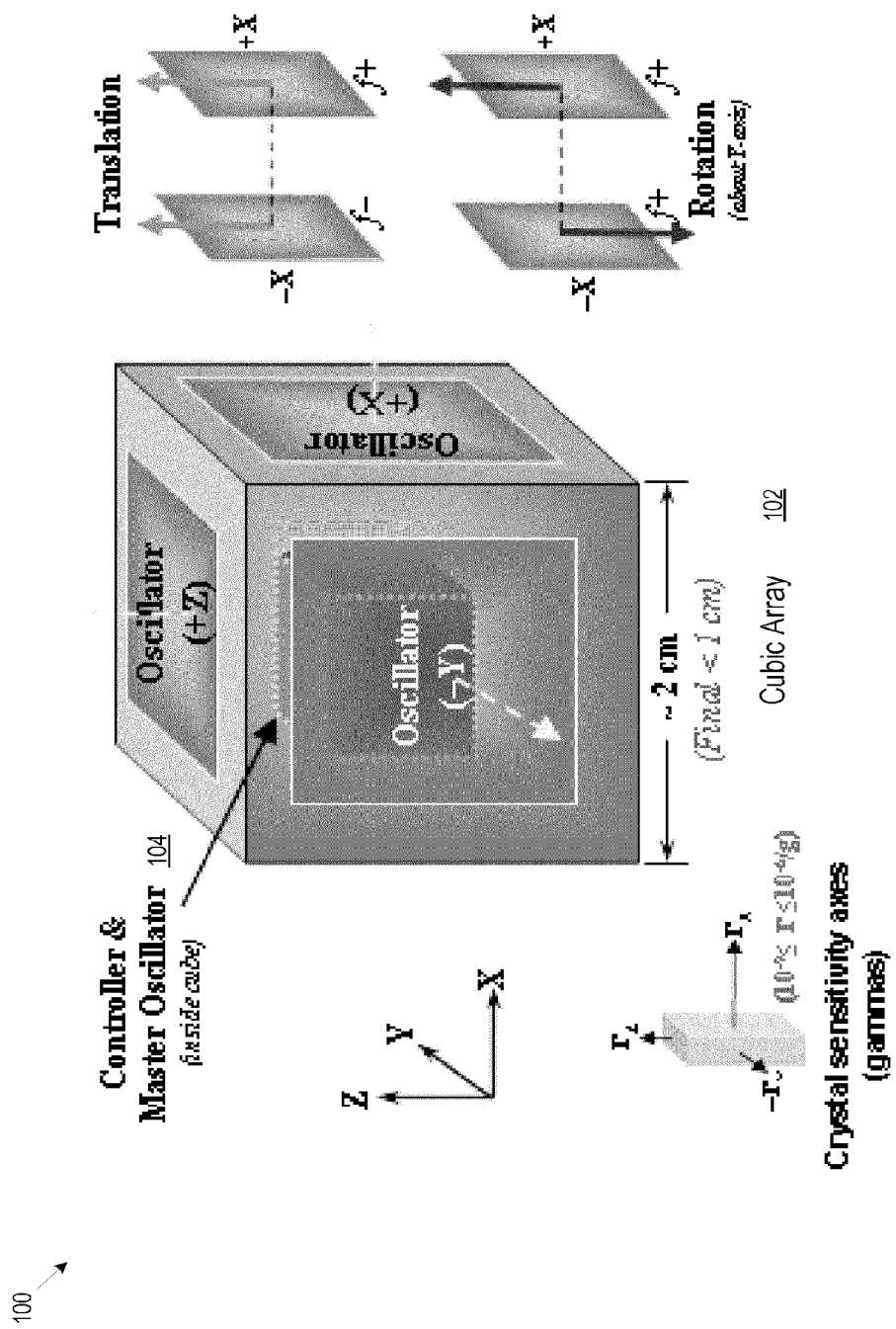
FIG. 1 shows a perspective view of a cubic array of the ORIENT system.

FIG. 1 shows a perspective view 100 of an example of a cubic array 102 of the ORIENT system. The inner cubic array 102 may include a determined number of oscillators, such as six arrayed oscillators, each oscillator placed on opposite faces of the cube, corresponding to directions +X, −X, +Y, −Y, +Z, and −Z, normal to the planes of the respective oscillators. Thus, a pair of matched oscillators may lie oppositely oriented on each orthogonal axis (X, Y, Z) of a cube.

The oscillators may include piezoelectric quartz crystals and may be affected by directional stresses due to accelerations. The placement of pairs of oscillators, such as the three bi-orthogonal oscillator pairs, may reduce motion-generated frequency shifts of the array output signals, since to a first order the acceleration-induced frequency shifts may cancel in the combined array. The slight changes due to acceleration of the oscillator circuits themselves, though usually at least an order of magnitude lower than the crystal effects, may be similarly cancelled by the cubic array configuration.

The cubic array 102 may be configured to be used as a "clock"—to keep track of time. For the cubic array 102, a 7th oscillator 104 may be provided and coupled to the arrayed oscillators. The 7th oscillator 104 may be a master oscillator that may be controlled by the outputs of the six other oscillators, and may output signals which may be used to keep track of time. While FIG. 1 indicates the 7th oscillator 104 is disposed inside the inner cubic array 102, the physical positioning of the 7th oscillator 104 is not limited to the inside of the cubic array 102.

Figure 2:
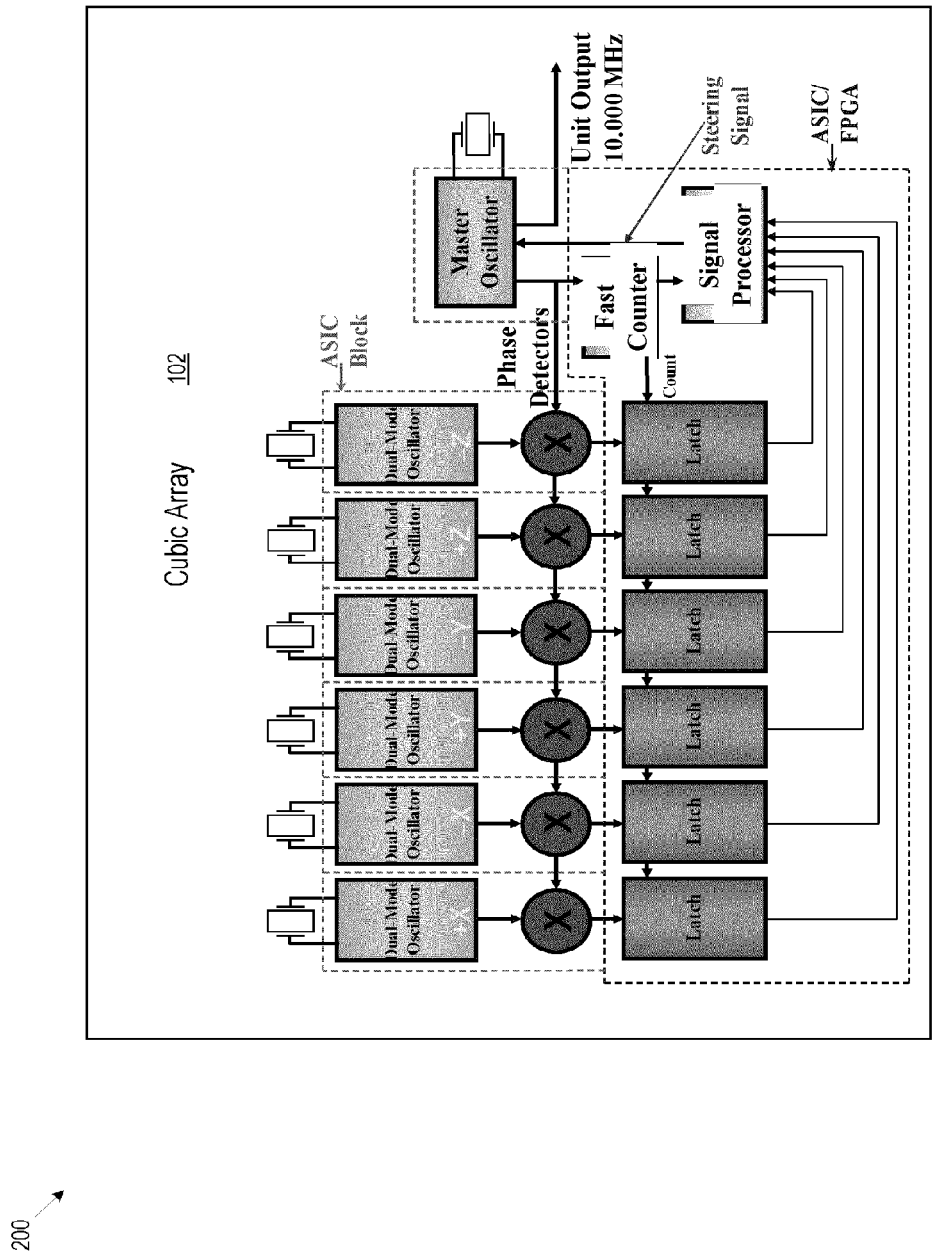
FIG. 2 shows a diagram of a detailed view of the cubic array.

FIG. 2 shows a diagram of an example detailed view 200 of the cubic array 102. The cubic array 102 may be a fully integrated ensemble of a determined number, such as seven (six and a master oscillator), precision, small, low-power quartz-crystal timing oscillators, tightly matched and compensated, both individually and as a unit, for temperature, shock/acceleration effects, and long-term drift. The cubic array 102 may exhibit: (1) rubidium-like stability at much lower size, weight, and power; (2) high acceleration and shock tolerance; (3) wider ambient operating temperature range; and (4) high reliability. In an embodiment, high reliability may be achieved by providing a clock check system, such as an internal Particle filter or other algorithms to reject data from clocks (for example, oscillators) that do not meet certain statistical criteria. The output stability of the Particle filter (in both frequency and time) may be better than the best of the clocks in the cubic array. The Particle filter may also significantly reduce the clock deviation errors from other than Gaussian white-noise behavior.

The cubic array 102 may provide short-term timing and frequency performance superior to much higher-power quartz or atomic clock implementations, yet may retain the ability to be long-term calibrated via managed external references such as GPS or TPS. The cubic array 102 may be much more rugged and power-efficient than chip-scale atomic clock (CSAC) or rubidium clocks, while maintaining comparable levels of stability with reasonable calibration intervals.

While the example of FIG. 2 shows the oscillators disposed or positioned substantially in a line, the oscillators of the cubic array may be disposed in a cubic or other regular polyhedral configurations, such as, for example, a dodecahedron (12-sided solid). As discussed above, when deployed in a cubic configuration with three pairs of bi-orthogonally mounted sensing crystal oscillators, the cubic array may provide effective first-order cancellation of acceleration effects by dynamically averaging the frequency shifts of oppositely mounted crystals.

Figure 3:
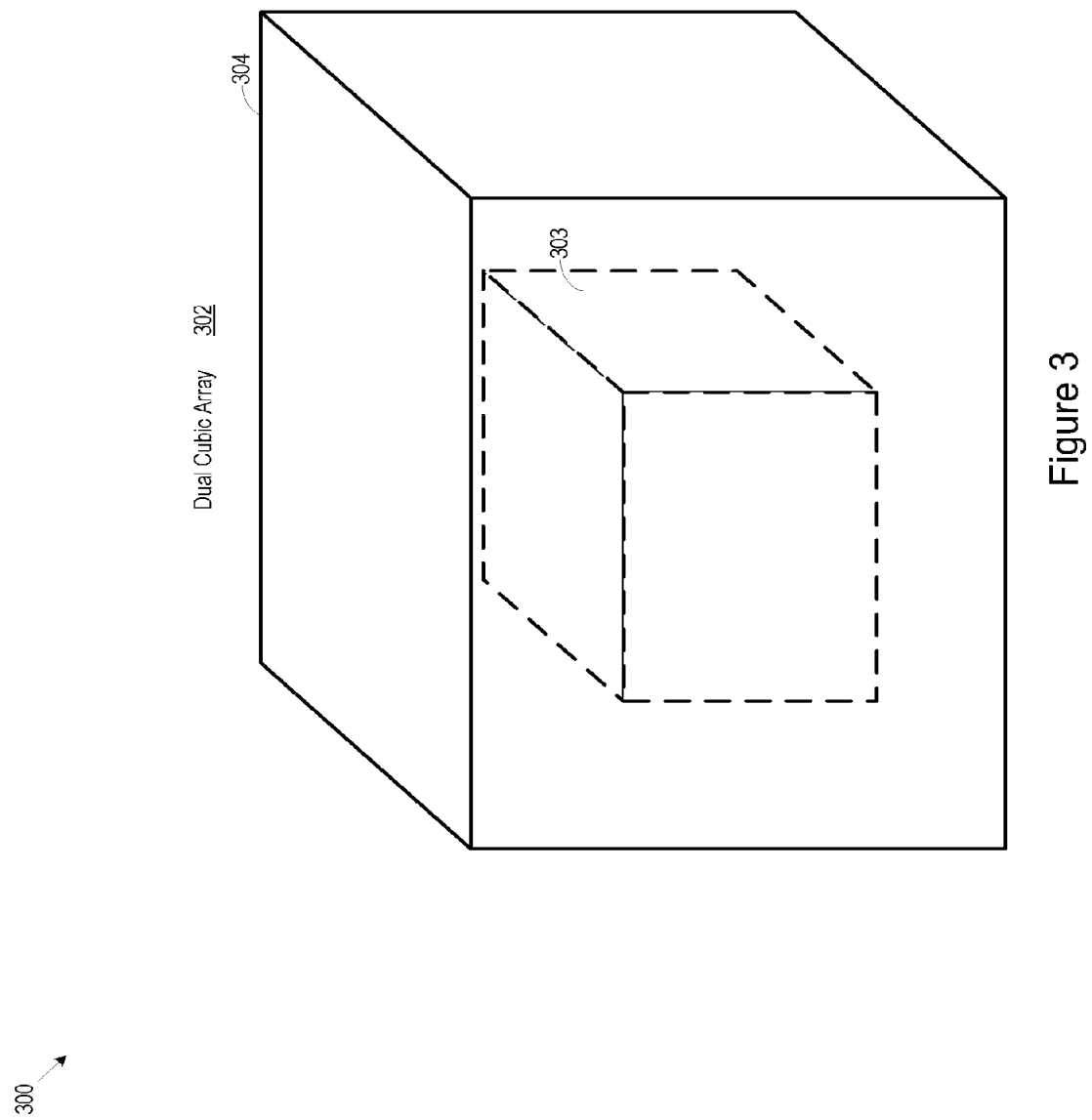
FIG. 3 shows a diagram of a dual-cubic array.

FIG. 3 shows a diagram 300 of an example dual-cubic array 302, which may include an inner cubic array 303 and the outer cubic array 304. The inner cubic array 303 may be implemented with the cubic array 102. The inner cubic array 303 may be situated inside the outer cubic array 304. The outer cubic array 304, via differential frequency measurements, may accurately measure both linear and rotational accelerations in all six directions (X, Y, Z, roll, pitch, and yaw) relative to the dual cubic array 302 at a main-axis frequency sensitivity of about $10^{-6}$/g. With a nominal noise floor at about $10^{-11}$, acceleration measurements down to about 10 μg are possible. As used herein, the symbol "~" represents about. This performance level may allow the outer cubic array 304 to "flywheel" both time and position from a reference GPS or TPS position/time fix accurately for several hours to days when GPS or TPS reception is lost. In one example, the projected timing holdover figures (RMS) may be 50 ns [1 hr], 1.2 μs [24 hr], and 35 μs [1 mo]; the corresponding position drift figures may be 0.2 m [1 hr], 0.8 m [24 hr], and 4.4 m [1 mo].

For the inner cubic array 303, crystals with low sensitivities of the operating frequency to motional accelerations may be used. The use of low-sensitivity crystals may provide for a stable clock performance, for example timekeeping accuracy and low drift, in dynamic environments. The sensitivity may be represented by a parameter Δy/Δa, a proportional change in frequency in response to a given acceleration of the crystal (or oscillator). This parameter may be referred to as gamma (Γ). Gamma may be a function of the specific crystallographic axis and the direction and magnitude of the acceleration vector.

Since for most environments the dominant acceleration factor is the earth's gravity, g (~9.8 m/s²), the value of gamma for low sensitivities may be in the range of $10^{-8}$/g to $10^{-9}$/g, and preferably approach $10^{-11}$/g.

The outer cubic array 304 may be configured to be used as orthogonal accelerometers ("sensors"). The outer cubic 304 may include a second set of crystal-driven oscillators or other means such as MEMS accelerometers, for sensing with higher gammas as compared to the oscillators used for the clocks in the inner cubic array 102. The gamma for the outer cubic array 304 may be, for example, $10^{-6}/g$. The outer cubic array 304 may exhibit greater sensitivity (higher gammas) and may be configured to exhibit a larger motional aperture to improve its sensitivity to rotations.

A description of the performance of an example embodiment of a basic single cubic-configuration oscillator system is shown below, given the following assumptions:

$$\Gamma(\text{nominal})=\gamma/g \sim 2\times 10^{-9}/g$$

$$\text{Measurement noise floor (flicker-limited)} \sim 2\times 10^{-12}$$
$$(\tau=1 \text{ sec})$$

$$\text{Gravitational acceleration}=g \sim 9.8 \text{ m/s}^2$$

$$\text{Earth's radius (mean)} \sim 6371 \text{ km}=6.371\times 10^6 \text{ m}$$

Thus, for a point on the earth's surface, the overall centripetal acceleration may be given by:

$$a_r=\omega^2 r=(2\pi/24)^2 \cdot r=(\pi/12)^2 \text{ hr}^{-2} \times 6.37\times 10^6$$
$$\text{m} \sim 0.03387776 \text{ m/s}^2=3.457\times 10^{-3} \text{ g}$$

Thus for $\theta=2\times 10^{-9}/g$, the frequency change is:

$$\Delta f_{ef}/f=\Gamma \cdot a_r \sim (2\times 10^{-9}/g)(3.457\times 10^{-3} g)=6.914\times 10^{-12}.$$

As shown in FIG. 1, a cubic array of the system may be configured in a predetermined size, such as a 2-cm edge cube. The radius (moment arm) for this configuration is thus 1 cm. For a nominal platform angular rotation rate of 1°/sec, the corresponding acceleration figures are:

$$1°/\text{sec} \sim 0.01745 \text{ rad/sec}$$

$$a_r=\omega^2 r=(0.01 \text{ m})(0.017 \text{ rad/sec})^2 \sim 3.045\times 10^{-6}$$
$$\text{m/s}^2=3.1\times 10^{-7} g$$

and finally, $\Delta f/f=\Gamma \cdot a_r \sim (2\times 10^{-9}/g)(3.1\times 10^{-7} g)=6.2\times 10^{-16}$.

Assuming the rotation is in a principal plane of the cube, the dual-cubic array configuration will quadruple the effective sensitivity to $\sim 2.44\times 10^{-15}$.

In an embodiment, a single cubic array configuration, such as the cubic array 102 as shown in FIGS. 1 and 2, may be used to serve as both a clock and an inertial sensor. If higher-$\Gamma$ crystals or sensors (for example, with $\Gamma \sim 2\times 10^{-6}/g$) are used for the acceleration/inertial sensing for the nominal cubic array configuration, the ORIENT system can have much higher sensitivities. Returning to the 1°/sec rotating-platform scenario above, we have:

$$1°/\text{sec} \sim 0.01745 \text{ rad/sec}$$

$$a_r=\omega^2 r=(0.01 \text{ m})(0.017 \text{ rad/sec})^2 \sim 3.045\times 10^{-6}$$
$$\text{m/s}^2=3.1\times 10^{-7} g$$

and thus, $\Delta f/f=\Gamma \cdot a_r \sim (2\times 10^{-6}/g)(3.1\times 10^{-7} g)(4)=2.48\times 10^{-12}$.

This sensitivity level is near the nominal measurement flicker floor. In the inner or outer cubic array, PM- or FM-demodulation of the oscillator waveforms may be performed, since any unit motion will be reflected in very low-level PM/FM modulation sidebands, albeit at quite low frequencies (a few Hz at best). Since the intrinsic oscillator output signals generally have high signal-to-noise ratios ("SNRs"), successful detection of modulation levels as low as those from earth rotation may be made, given sufficient post-demodulation averaging times. Assuming a nominal oscillator output frequency of 10.00 MHz and the higher crystal gammas as above, a 1°/sec rotation at the earth's surface will produce a frequency deviation [$\Delta f$] of $(2.48\times 10^{-12})\times (1.00\times 10^7)=2.48\times 10^{-5}$ Hz, which yields a phase progression of 8.928 m°/sec, which is detectable with high-quality electronic phase-detection circuitry driven by a suitably stable reference signal.

A wide variety of analog and digital circuitry can be used to implement such PM or FM detectors, including phase-locked loops and direct digital synthesizer ("DDS") type circuits, which consist of digital accumulators, registers, and counters, coupled to digital-to-analog converters ("D/As") to produce the desired analog output signals with very fine control of amplitude and phase. To achieve long phase-averaging times and thus effectively compensate long-term (low-frequency) phase noise, the standard digital accumulator widths (i.e., number of bits) can be increased to achieve the large counts required for averaging over long periods (hours to days), especially for high-stability timekeeping clock applications. These DDS subsystems may be tailored to produce low spurious components at both low and high frequencies. This embodiment may also include use of high-resolution D/A converters (typically 16 to 24 bits), often with sigma-delta or other architectures capable of low-spurious output signal components.

The ORIENT system for timekeeping and/or accelerometry may include high-performance analog oscillators, such as an array of seven for a single cubic unit, or thirteen for dual-cubic configurations. Alternative DDS-based circuits may also be used, either for all oscillators or at least the master oscillator 104, which may be generally frequency- and phase-controlled by a weighted combination of the other, independent oscillators. As discussed above, the independent oscillators may serve as acceleration sensors. DDS implementations of the oscillators or ancillary phase-locked loop filtering circuits may provide increased flexibility in selecting or adaptively programming loop filter cutoff frequencies and time constants, separating environmentally-induced vibrational frequency bands from long-term drift mechanisms, and providing dynamically adaptive or programmable loop and/or processing filters within the oscillator systems for special-application scenarios.

Digital implementations, including FPGAs, microprocessors and microcomputers, may also be generally used in oscillator systems for implementing additional control functions, logic operation, numerical processing, power management, drift compensation, and data storage, preferably for calibration constants, trends, and adaptive processing algorithms. The application of PM, FM and/or AM demodulators may also be useful for sensing environmental changes in the oscillator-system output-signal phase, frequency, and amplitude, as well as detecting any mal-performance of oscillator circuitry or excessive deviations in critical operational or environmental parameters which may impair system accuracy or stability.

Dual-/Multi-Mode Oscillator

In an embodiment of the ORIENT system with dual cubic array 302, quartz crystals which may be operated in multiple simultaneous vibration modes may be used as oscillators. This approach is teimed the dual-mode oscillator ("DMO") or multi-mode oscillator ("MMO"), depending on the number of oscillator modes used. In an embodiment, the differential DMO/MMO circuit may reduce the close-in (low-frequency) phase noise by about a factor of 100. A main oscillation mode (for example, a $C_3$ mode) of the crystal is generally the source of the output signal but may be slightly frequency-corrected according to the internally measured crystal temperature and subsequently used as the final stabilized output. This approach may be called the temperature-compensated crystal oscillator ("TCXO") approach. A temperature-measurement ("T") mode (for example, a $B_5$ mode) may be used to determine the actual temperature of the quartz blank itself. The separate T mode allows this embodiment of the ORIENT system to measure temperature to a higher accuracy as compared with methods such as using thermistors or RTDs.

In a DMO TCXO configuration of the ORIENT system, different modes of different crystals may be used. In a third-overtone stress-compensated (SC) cut crystal, the main ($C_3$) mode has a temperature-versus-frequency coefficient of about ±1 ppm/° C., whereas the secondary ($B_3$) mode frequency has an average coefficient of approximately –27 ppm/° C. IT cut crystals may show similar characteristics; other cuts such as AT may show generally less preferable characteristics in both short- and long-term stability (and correspondingly in low-frequency phase noise).

For temperature compensation, SC cut or other doubly rotated crystals (for example, IT cut) of the secondary B mode of the crystal may be used. The B mode of the crystal propagates acoustic waves in the crystal lattice in a roughly orthogonal mode compared to the normal, stable C mode. For an SC cut crystal with a third-overtone C mode ("$C_3$") at 10.00 MHz, the third-overtone B mode ("$B_3$") occurs at roughly 10.8 MHz and has a temperature coefficient of about –26.7 ppm/° C., versus the $C_3$ mode temperature coefficient of about ±1 ppm/° C. Thus the B oscillating mode in such an SC cut crystal may serve as a tightly coupled thermometer, since it is actually measuring the temperature of the crystal itself rather than an adjacent component such as with a thermistor, RTD, thermocouple, or such.

In a $B_3$-$C_3$ dual-mode oscillator ("DMO") configuration, an output frequency derived from mixing (subtracting or beating) the $B_3$ and $C_3$ mode frequencies, to produce a $B_3$-$C_3$ difference frequency, may be substantially linear versus crystal temperature.

In an embodiment, the B-C mode temperature-compensated configuration may use a fifth-overtone B ("$B_5$") mode, instead of the $B_3$ mode, to address temperature-induced instabilities, where at specific temperatures of the crystal lattice the acoustic energy can "jump" to different modes (and planes) of vibration. This effect may be referred to as a crystal "activity dip", where the desired mode may rather abruptly lose amplitude (activity) or "dip" as a result of this undesired exchange of acoustic energy within the crystal between the selected and another (spurious) mode. A typical example is where the normal $C_3$ mode oscillation undesirably jumps to the adjacent (and higher-gain) $B_3$ mode. This effect may also be called a mode jumping ("MJ"). In the B mode there may be temperature regions of instability mixed in with regions of normal operation, though the positions (temperature zones) of these regions are not completely stable with time. This jump phenomenon causes abrupt discontinuities in the oscillator output frequency and phase, which due to hysteresis may not return to the starting points when the temperature is cycled back to the original value.

Figure 4:
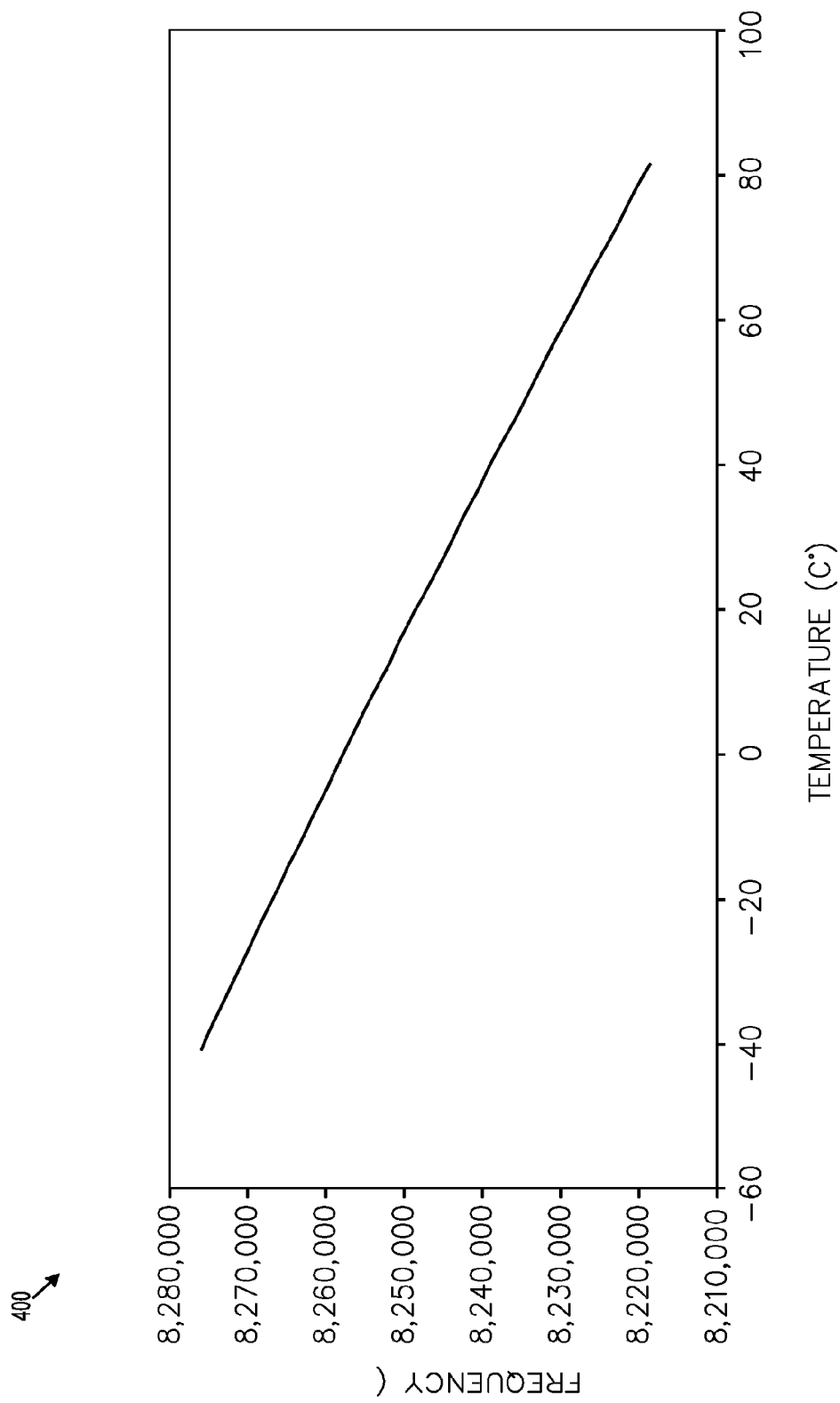
FIG. 4 shows a plot of the frequency-versus-temperature linearity of the crystal's $B_5$ mode.

The $B_5$ oscillation mode tracks crystal temperature very linearly and is free, or substantially free, of the MJ behavior, which may be observed in the $C_3$-$B_3$ DMO configuration. This freedom from MJ may be preferred in clocks. Since in a typical 10.000-MHz $C_3$ oscillator the $B_5$ mode appears at ~18.4 MHz, the interaction observed between $C_3$ and $B_3$ modes that may induce MJ is absent or substantially reduced. FIG. 4 shows a plot of the frequency-versus-temperature linearity of the crystal's $B_5$ mode of an embodiment of ORIENT system. A usable beat frequency for this configuration is the simple difference $B_5$-$C_3$; an alternative, more mathematically accurate form of this beat frequency is $\frac{1}{5}B_5$-$\frac{1}{3}C_3$, where the computed values is preferably implemented via digital circuitry such as in FPGAs. Other similar proportional functions may also be employed for this temperature-monitoring purpose.

The crystal's $B_1$ mode may also be used if sufficiently stable (assuming the crystal was appropriately configured so as not to suppress that mode). Alternatively, $A_n$ modes for SC cut or IT cut crystals may also be used for temperature tracking (the corresponding A modes have higher resonant frequencies than the corresponding B modes, which are themselves higher than the same-indexed C modes).

Further, doubly rotated IT cut quartz crystals may also be used, since they also possess useable B modes. Since the IT cut units may be processed to have turnover frequencies much closer to room temperature than corresponding SC cut crystals, they may be preferred for near room-temperature applications such as for low-power TCXOs. For example, using an IT cut crystal with a standard $C_3$ oscillation mode at 10.002 MHz (with the 2-kHz offset from the nominal frequency for multiple-oscillator ensembling purposes), the corresponding $B_5$ mode of the crystal may occur at 18.432 MHz. This frequency allows easier separation from the $C_3$ mode with low-cost, low-complexity filters since the proportional difference is >80% rather than ~9% as with the $B_3$ mode. In addition, the frequency-versus-temperature linearity of the $B_5$ mode is mostly higher than the $B_3$ mode, further improving the simplicity and robustness of this DMO circuit design. The IT cut crystal may be preferred for use in the low-power TCXO application in comparison, to an SC cut unit, whose frequency-versus-temperature coefficient is on the order of ±10 ppm/° C. near 25° C., whereas the IT cut unit is at least 25% less.

The $B_5$ mode of the IT cut crystal may typically exhibit a series resistance of about 165-170 ohms, compared with the $C_3$-mode resistance of 35-38 ohms. The higher resistance of the B5 mode of the IT cut crystal helps eliminate or substantially reduce the mode-jumping. In SC cut crystals, the corresponding mode resistances are 54-58Ω for $C_3$, under 50Ω for $B_3$ and >150Ω for $B_5$ modes. Thus, MJ may be eliminated or substantially reduced in SC cut crystals when the $B_5$-$C_3$ DMO configuration is used. In an embodiment, digital logic may be added to an analog oscillator to handle frequency measurements and comparisons between the various $C_n$ and $B_m$ modes to serve specific crystal and circuit requirements.

In another embodiment, the ORIENT system may include a multi-mode oscillator ("MMO") configuration. The MMO configuration may include the fundamental C ("$C_1$") mode, the $C_3$ mode, and a $B_3$ mode, of the SC cut crystal. $C_1$ and $C_3$ modes both use C-plane vibrations and are each stable and predictable with temperature and are free of jumps over a wide range of temperatures, including a preferred range of about –55° C. to +125° C. In another embodiment of the MMO configuration, the $B_5$ mode may be used instead of the $C_1$ mode.

Figure 5:
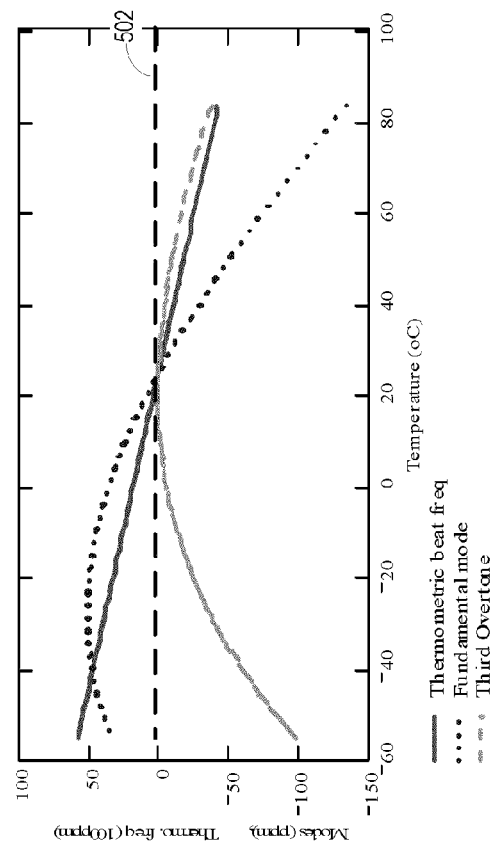
FIG. 5 shows a graph illustrating the result of the temperature-compensation performance of an embodiment.

The oscillator system using the MMO configuration may be operable to detect MJ of a $B_3$-$C_3$ pair of the MMO. When no MJ or other unstable operation is detected on the $B_3$ mode, the MMO system may utilize the $B_3$-$C_3$ pair. The MMO system may switch to the $C_3$-$C_1$ setup when MJ is detected on the $B_3$ mode, or when the $B_3$ mode becomes otherwise unstable or unsuitable for measuring temperature data. In this case, the discontinuities of the B mode may be ignored and the $C_1$ temperature data may be utilized until the $B_3$ mode is determined to be sufficiently stable to be employed again. In all cases, the stable, continuous $C_3$ mode may handle the actual oscillator output frequency and phase (time) generation tasks. FIG. 5 shows a graph 500 illustrating an example of the result of the temperature-compensation performance of the ORIENT system using DMO in TCXO configuration. The flat dotted line 502 shows a result of the frequency correction.

Mode Jumping Detection and Reduction Methods

Several methods of MJ detection or reduction of the effects of MJ for the MMO or other DMO circuits may be used, as described below.

In an embodiment, broadband or narrowband noise may be added to the oscillator loop to reduce MJ. Preferably, harmonics and/or subharmonics can be summed into the crystal-drive signal to reduce MJ. Jumps into the B mode may be significantly reduced or eliminated by ramping up the oscillator frequency at a controlled rate during oscillator startup or by injecting radio frequency (RF) energy near the desired (for example, C-mode) frequencies via external means. Phase shifts, harmonics, or phase-controlled haimonic components in the oscillator electronics may be used to shift the crystal out of undesired modes (for example, jump-prone or other unstable or undesirable modes), by analog, digital, or combination (hybrid analog/digital) means.

In another embodiment, the method may detect the oscillator loop phase to determine MJ. If detected, the loop phase may be perturbed to "kick" the crystal back into the proper mode. Bandpass filters (BPFs) to control the phase and reduce or eliminate spurious oscillation modes may be inserted into the loop for startup and then switched out for normal operation after the loop stabilizes.

As discussed above, using a $B_5$ mode instead of $B_3$ mode allows MJ to be substantially reduced or eliminated.

Other methods of oscillator-loop mode control include limiting the permissible rate of phase change (vs. time) in the oscillator loop (subject to system constraints), via analog, digital, or hybrid techniques. Also, cross-coupling the 2, 3, or more oscillator control voltages (one per oscillator or controlled mode) can be used to detect and/or control MJs.

Controlled oscillator startup may be implemented by using DDS at first to select the desired crystal mode (the "seed" frequency), then once the crystal is stably oscillating on the desired mode, switching within the overall loop to a more conventional analog oscillator circuit.

Differential Oscillator

Figure 6:
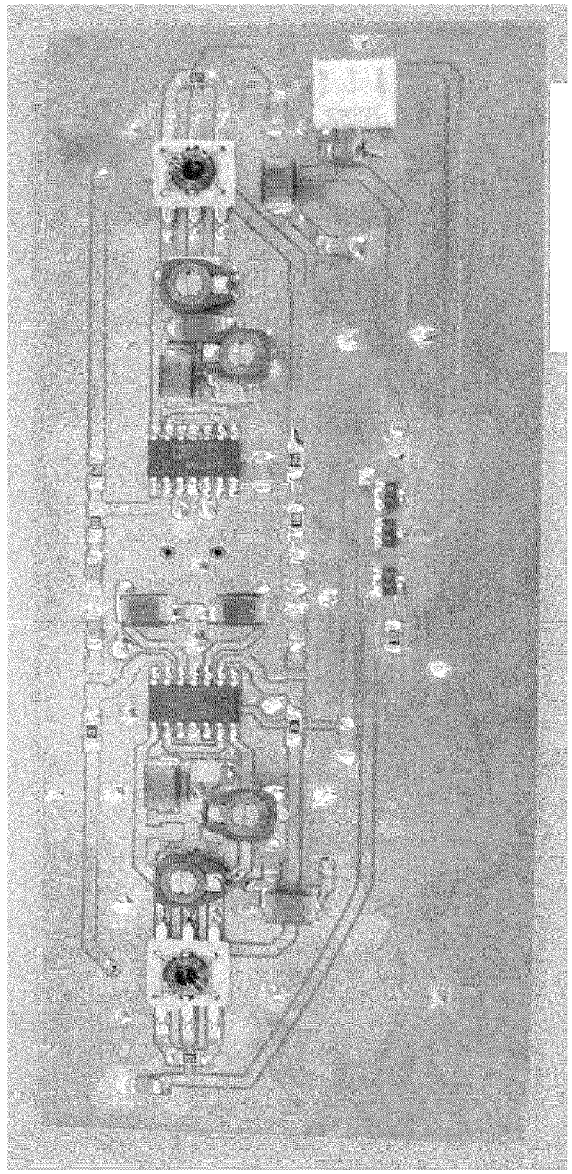
FIG. 6 shows a photograph of a differential oscillator circuit
Figure 7:
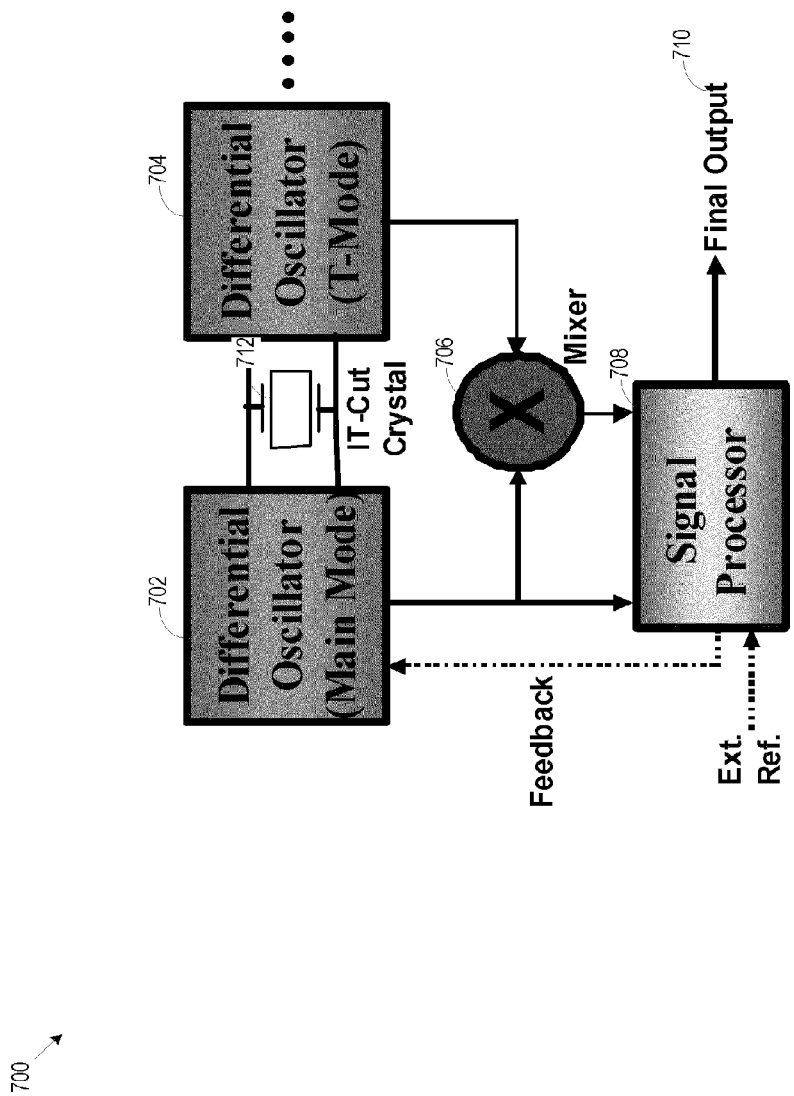
FIG. 7 shows a block diagram of a differential DMO circuit of an embodiment.

In an embodiment, the ORIENT system may implement a differential configuration for the oscillators. FIG. 6 shows a photograph 600 of an example differential oscillator circuit. The differential oscillator circuit may be implemented in a substantially symmetrical layout, which may contribute to the electrical balance of two mirror-image halves of the system. FIG. 7 shows a block diagram 700 of an example of a differential DMO circuit which may be used in the ORIENT system. While FIG. 7 shows an IT cut crystal 712, other types of crystals may also be used, as discussed above. The differential DMO circuit may include a first circuit 702 for separating a main mode signal from the output of the crystal, and a second circuit 704 for separating a secondary mode (T mode) signal from the output of the crystal. The first and second circuits 702 and 704 may be coupled to a mixer 706 and a signal processor 708, which may receive the signals output by the first and second circuits and generate a temperature-compensated final output 710.

Figure 8:
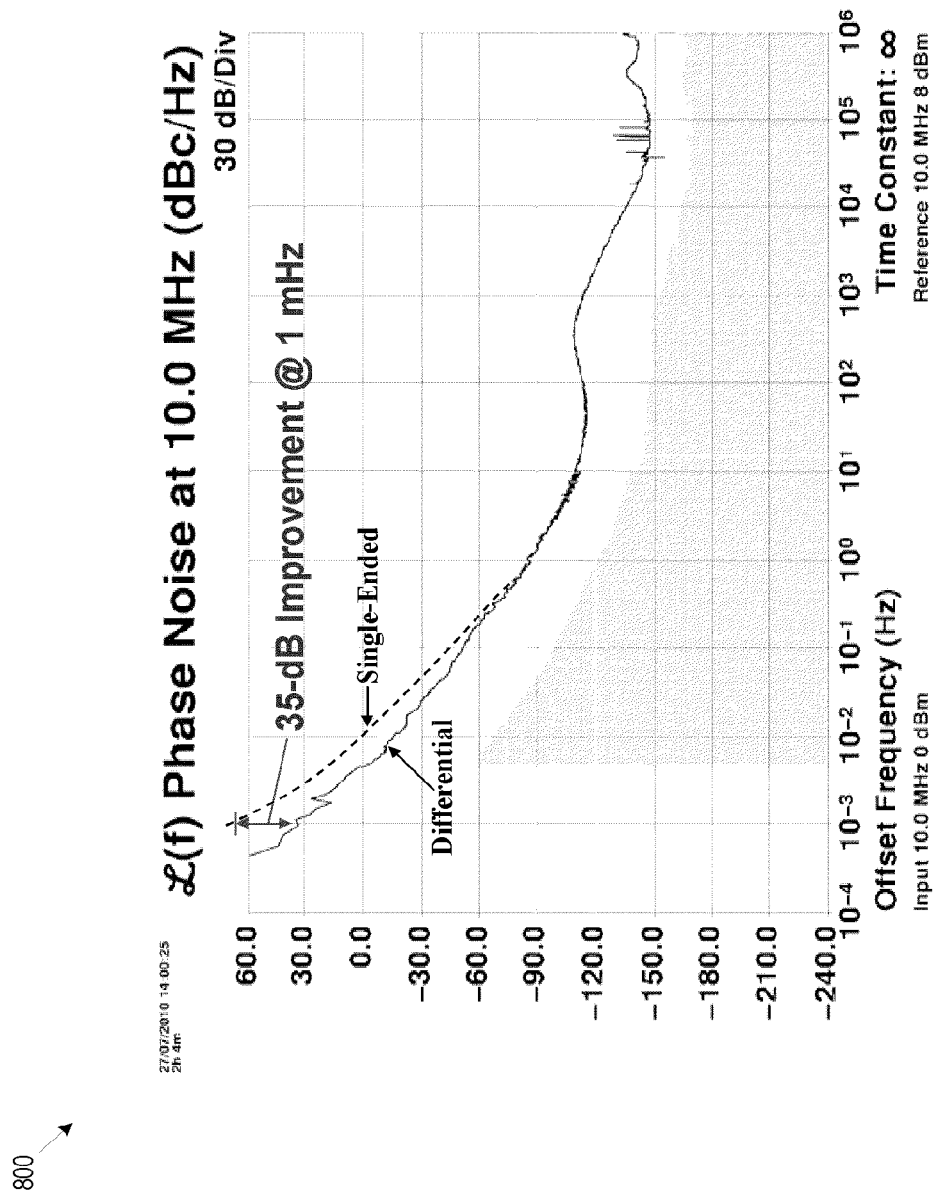
FIG. 8 shows a phase noise plot which compares the differential circuit implemented in an embodiment, and a single-ended oscillator electronic architecture.

FIG. 8 shows an example of a phase noise plot 800 which compares the differential circuit implemented in an embodiment, and a single-ended oscillator electronic architecture. As compared to a single-ended configuration, the differential circuit of an embodiment may provide reduced low-frequency phase noise.

Differential circuitry allows elimination or substantial reduction of common-mode bias drifts. Also, full-temperature bias compensation of all or substantially all critical oscillator electronic nodes may be implemented in ASIC-based circuits, which inherently can also provide device/offset matching on the order of ±1% or better. This is equivalent to a ≥40-dB suppression of common-mode effects. The improved balance of the differential circuit configuration provides improved even-order harmonic suppression and further helps minimize level-dependent bias shifts in the oscillator output waveforms. Such features allow realization of reduced low-frequency (for example, <1-Hz) phase noise in the final output, which is often indistinguishable from bias drifts. This reduction of low-offset phase noise is preferable for high-quality timekeeping oscillators ("clocks").

In an embodiment, the ORIENT system may include automatic oscillator gain-control ("AGC") loops to provide improved frequency stability in critical, high-precision applications since the slight nonlinearities of real quartz crystals transform small drive-level variations into phase/frequency shifts due to the AM-to-PM conversion process. Thus, an AGC loop may be preferably used in the oscillator to minimize this effect by presenting a very constant alternating current (AC) radio frequency (RF) drive level to the crystal terminals.

An AGC may further maintain the oscillation loop in a substantially linear mode, thus substantially reducing distortion- and noise-modulation effects on the output waveform and the consequent bias shifts therefrom which may increase the low-frequency phase noise of the unit. The improved linearity may substantially reduce AM-to-PM conversion in the loop, which may additionally reduce low-rate flicker and phase-jitter effects in the oscillator output signal.

In the case of the embodiments using DMOs or MMOs, two or more independent AGC'd loops may be implemented, which may provide high stability with reduced interaction between the loops. In addition, for startup or other transient conditions, customized cross-coupling (for example, decoupling) between the loops may be added. This may allow for rapid, predictable startup as well as attenuation of undesired cross-modulations between the loops, in both transient and steady-state cases.

AGCs may further allow the oscillator loops to maintain constant, moderate (for example, ~10-dB) potential forward loop gains (down-regulated by the normal AGC action) in each crystal mode. During startup, the oscillator circuit will provide extra loop gain to achieve the onset of normal oscillation; once steady-state operation is achieved, the nominal loop gain of any oscillator in settled, linear operation is precisely 0 dB (unity), but the loops can still be operated with an extra gain reserve to accommodate circuit drifts, crystal activity variations, temperature effects, and the like. This excess gain capability may allow, for example, higher overall short-term and long-term stabilities, higher amplitude and phase linearity of the oscillator circuitry, and faster, more predictable and repeatable startup and response to transients, and reduced power-supply-induced output glitches. Furthermore, the temperature-dependence of the electronics may be reduced by improving the loop-gain versus temperature characteristics of the oscillator proper. Finally, tight decoupling and temperature-compensation of all power-supply regulator sub-circuits may be preferable to substantially reduce bias drifts and their attendant effects on low-frequency phase noise in the oscillator output signals.

Figure 9A:
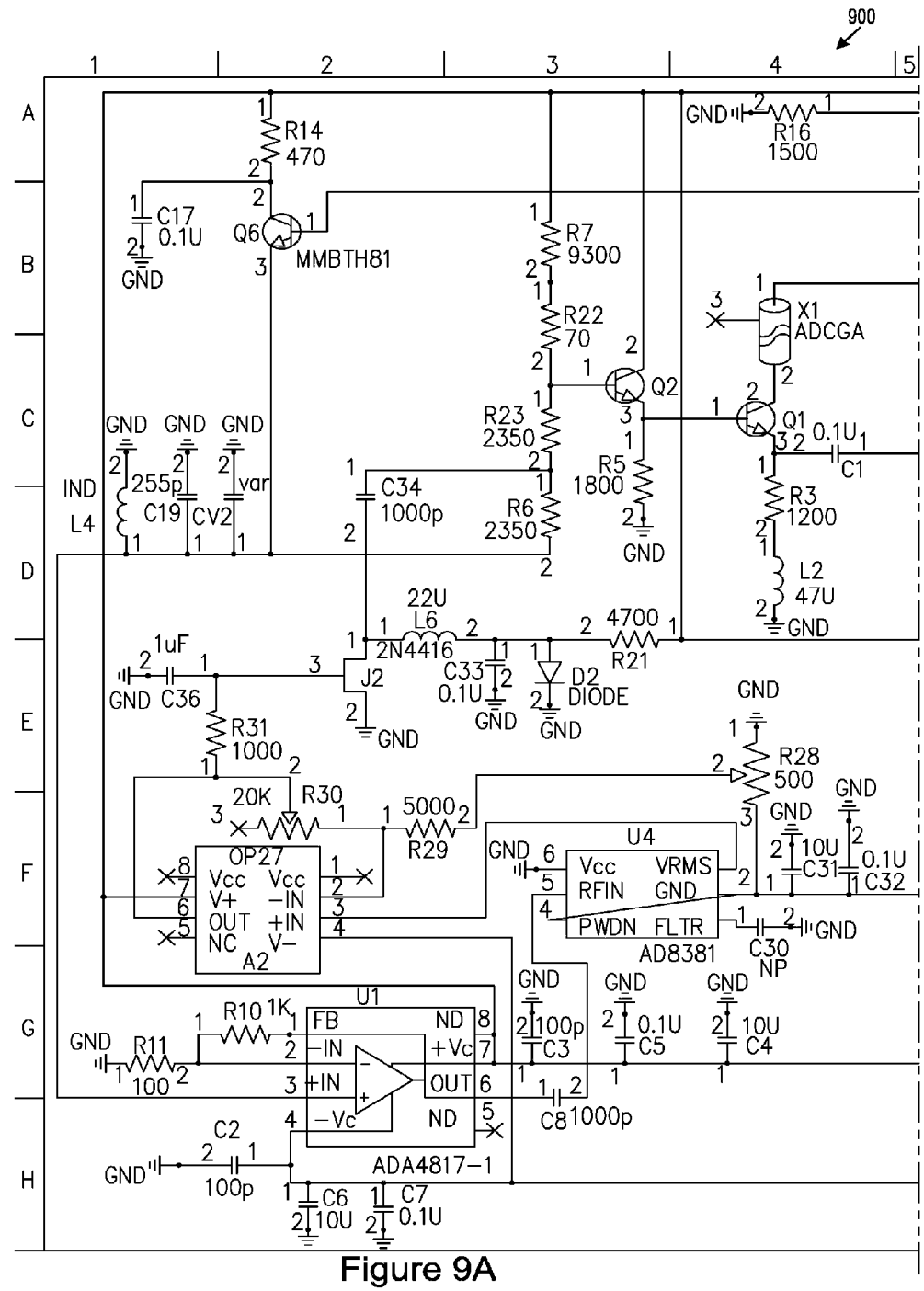
FIGS. 9A and 9B show a schematic diagram of a dual-mode differential oscillator circuit according to an embodiment.
Figure 9B:
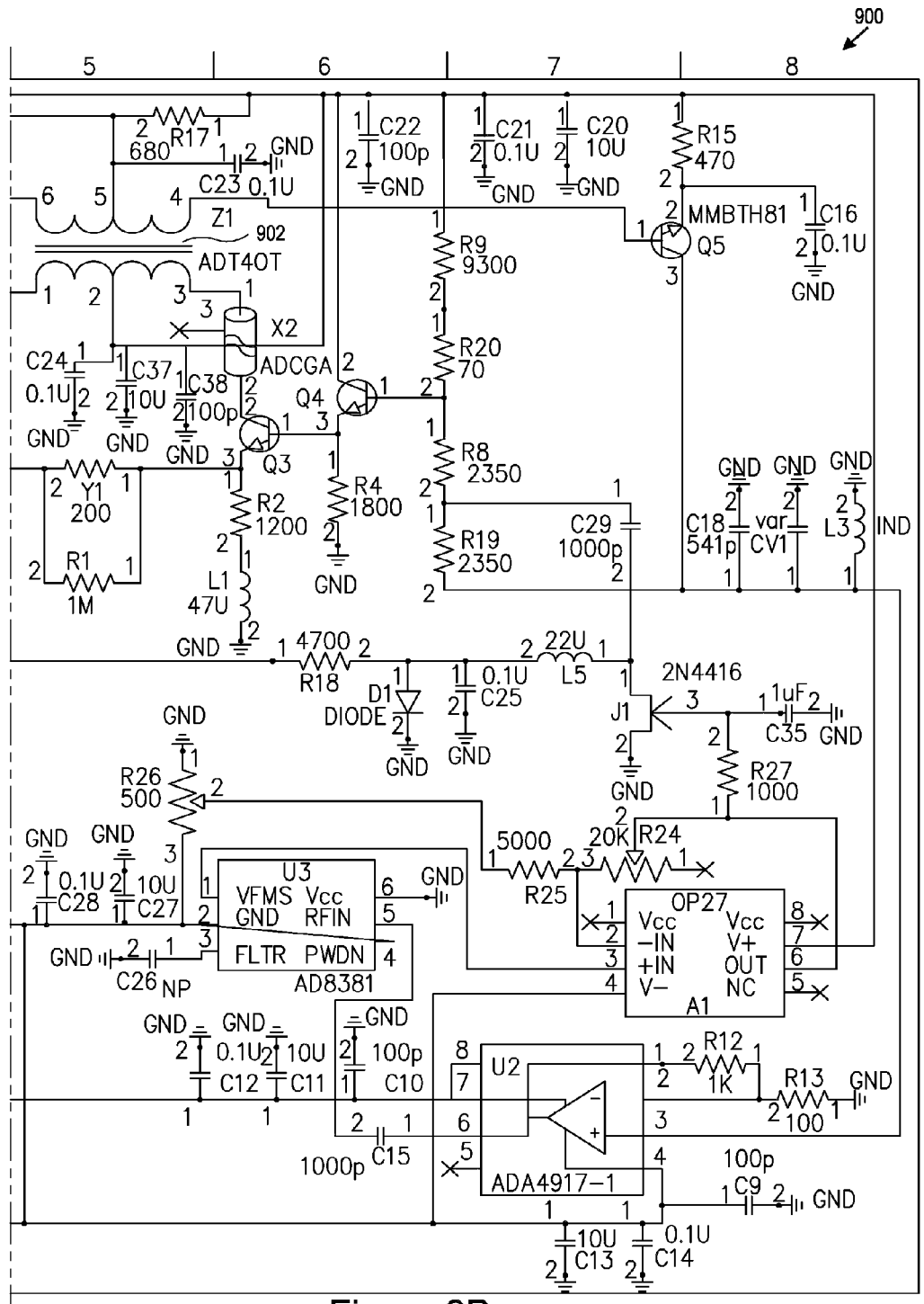

FIGS. 9A and 9B show a schematic diagram 900 of an example of a dual-mode differential oscillator circuit according to an embodiment, which includes the differential architecture, bias circuitry with temperature stabilization, high-performance power-supply decoupling, and independent linear loop AGC controls. A custom-designed RF transformer 902 may also be provided for improved differential circuit balance and signal isolation.

In general, quartz crystal temperature stability may be improved by operating substantially at the natural series-resonant frequency of the desired crystal vibration mode. Consequently, an automatic frequency-control ("AFC") loop in the oscillator may be provided to improve overall stability by keeping the actual oscillation frequency at the series-resonant point. While this will permit some drift of the crystal resonance, in a DMO configuration as in the ORIENT system, the relative crystal stability may be more important than the actual nominal frequency. An additional application of this effect may be in the TCXO application as discussed above, to temperature-compensate the primary crystal modes when using the quartz as a sensor (acceleration, chemical, or otherwise).

Figure 10A:
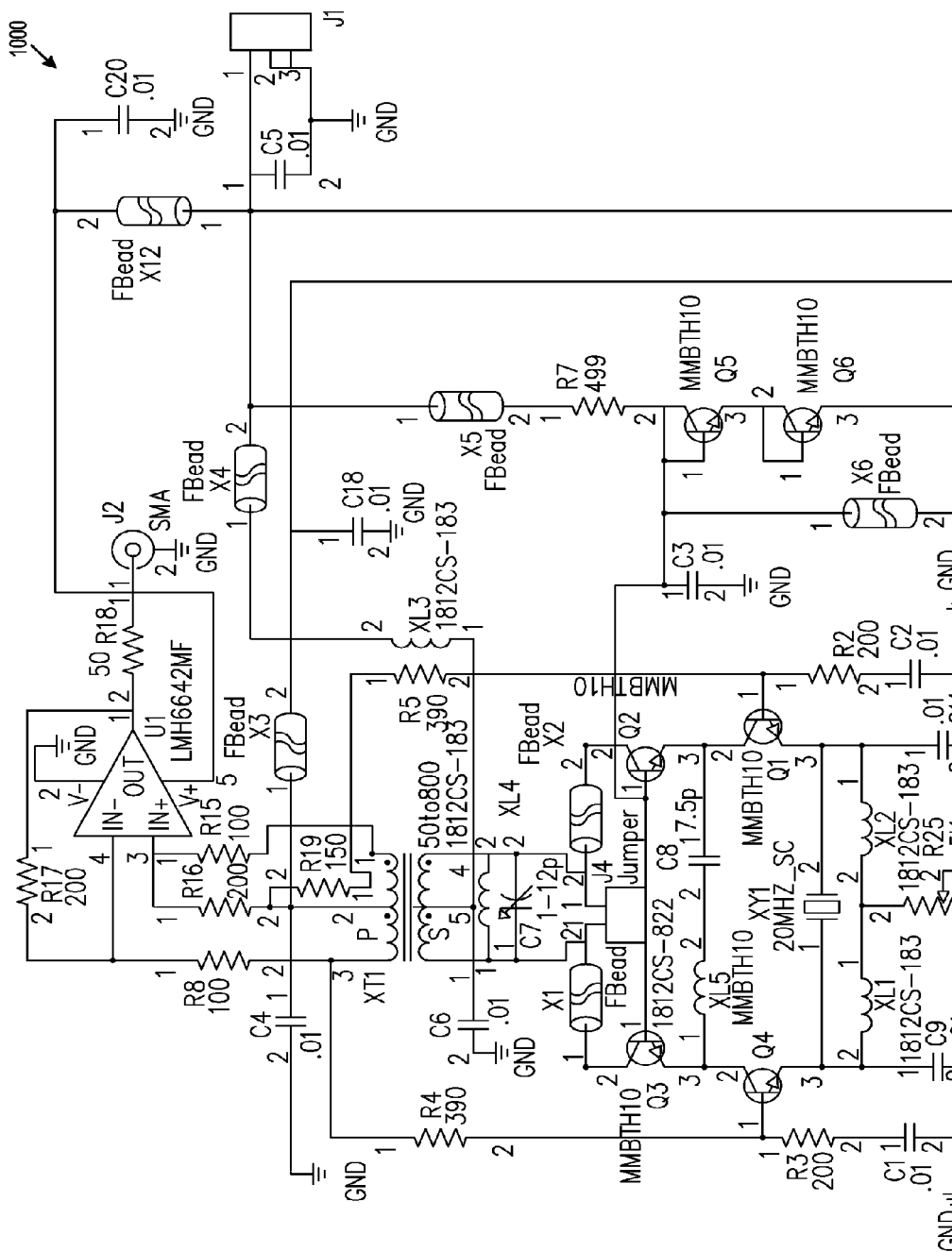
FIGS. 10A and 10B show a diagram of a dual-mode differential Driscoll oscillator circuit implementation.
Figure 10B:
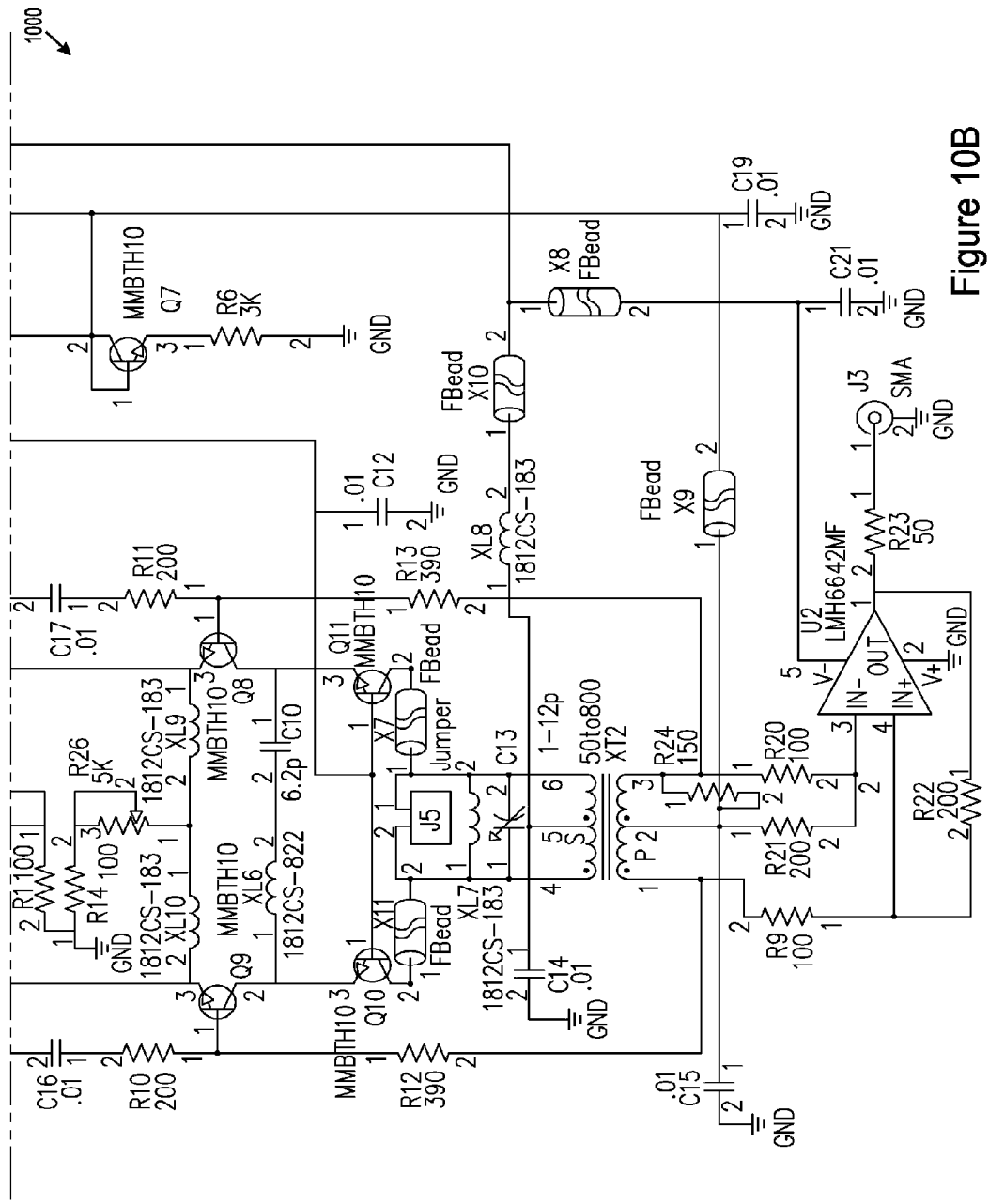

FIGS. 10A and 10B show a diagram 1000 of an example of a differential Driscoll dual-mode oscillator implementation. The two bipolar transistor differential pairs Q1-Q4 and Q8-Q9 operate with their emitters directly coupled to the crystal XY1, thus maintaining a low equivalent series resistance (ESR) at the crystal terminals, and also maintaining a maximum loaded Q and a consequently low degradation of the inherent phase noise of the crystal. The two differential transistor pairs in parallel present the equivalent load of a single unbalanced stage, thus achieving improved oscillator noise performance. Adjustable resistors R25 and R26 may set and balance the bias current in each differential pair. Inductors XL1, XL2, XL9, and XL10 may serve to provide alternating current ("AC") isolation for the bias paths and avoid direct current ("DC") potentials across the crystal, which in doubly-rotated cut units (for example, SC and IT) may cause stress and drift in the crystal itself. The combinations of C8-XL5 and C10-XL6 may be traps for the respective undesired crystal vibrational modes.

Resonant tank circuits C7-XL4 and C13-XL7 may be used across the balanced transformer primaries XT1 and XT2 for crystal mode selection, to separate the primary ($C_3$) from the secondary oscillation modes ($B_3$ or $B_5$). The balanced transformer secondary windings may be resistively terminated and feed differential buffer/output driver amplifiers U1 and U2. Feedback resistor pairs R3-R4, R2-R5, R10-R12, and R2-R11 may set the balanced stage gains to regulate the overall oscillator loop gain in each leg. C1, C2, C16, and C17 may allow AC coupling of the feedback paths. Finally, diode-connected transistors Q5, Q6, and Q7 may effect temperature compensation of the base bias for the differential cascode stages to hold the oscillator operating currents constant.

In an embodiment, monolithic (for example, integrated-circuit) "chip" construction may be used for implementing the elements discussed above for the differential circuit configuration. The use of monolithic transistors may provide improved bias stability, improved temperature tracking of various circuits on the same chip, and a high degree of matching (often better than 1%), especially over temperature. The differential circuit configuration may further include multiple-collector or multiple-drain devices for current-splitting. The area (and current) ratios may be 1:1, or other levels as determined based on the relative activity ratios of the two (or more) crystal modes utilized by the DMO or MMO circuit.

Monolithic dual-collector (or dual-drain) transistors may allow the suppression of spurious output components easier and also may lower the power consumption of the overall oscillator circuit.

Figure 11A:
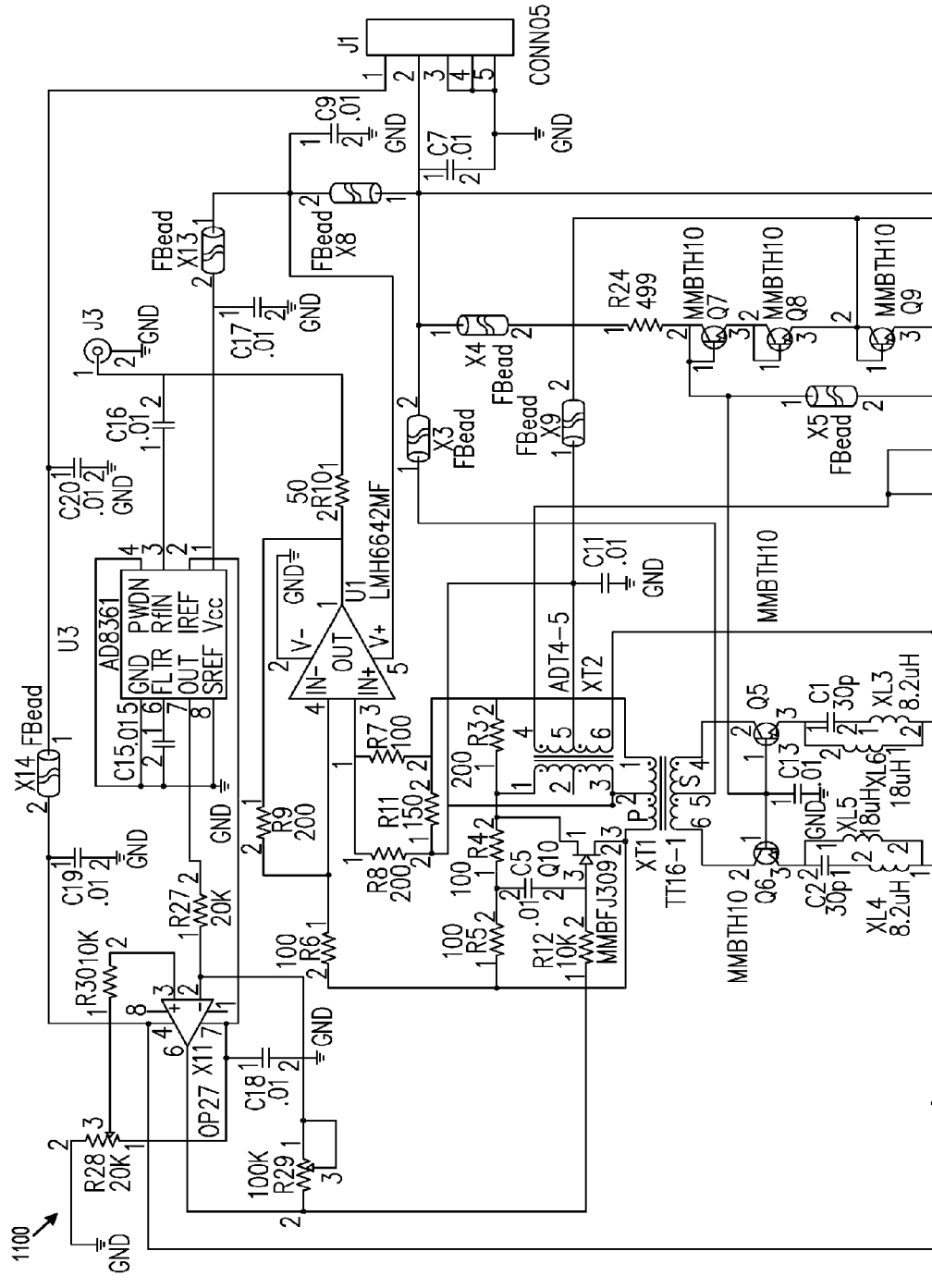
FIGS. 11A and 11B show a diagram of another embodiment of the dual-mode differential Driscoll circuit.
Figure 11B:
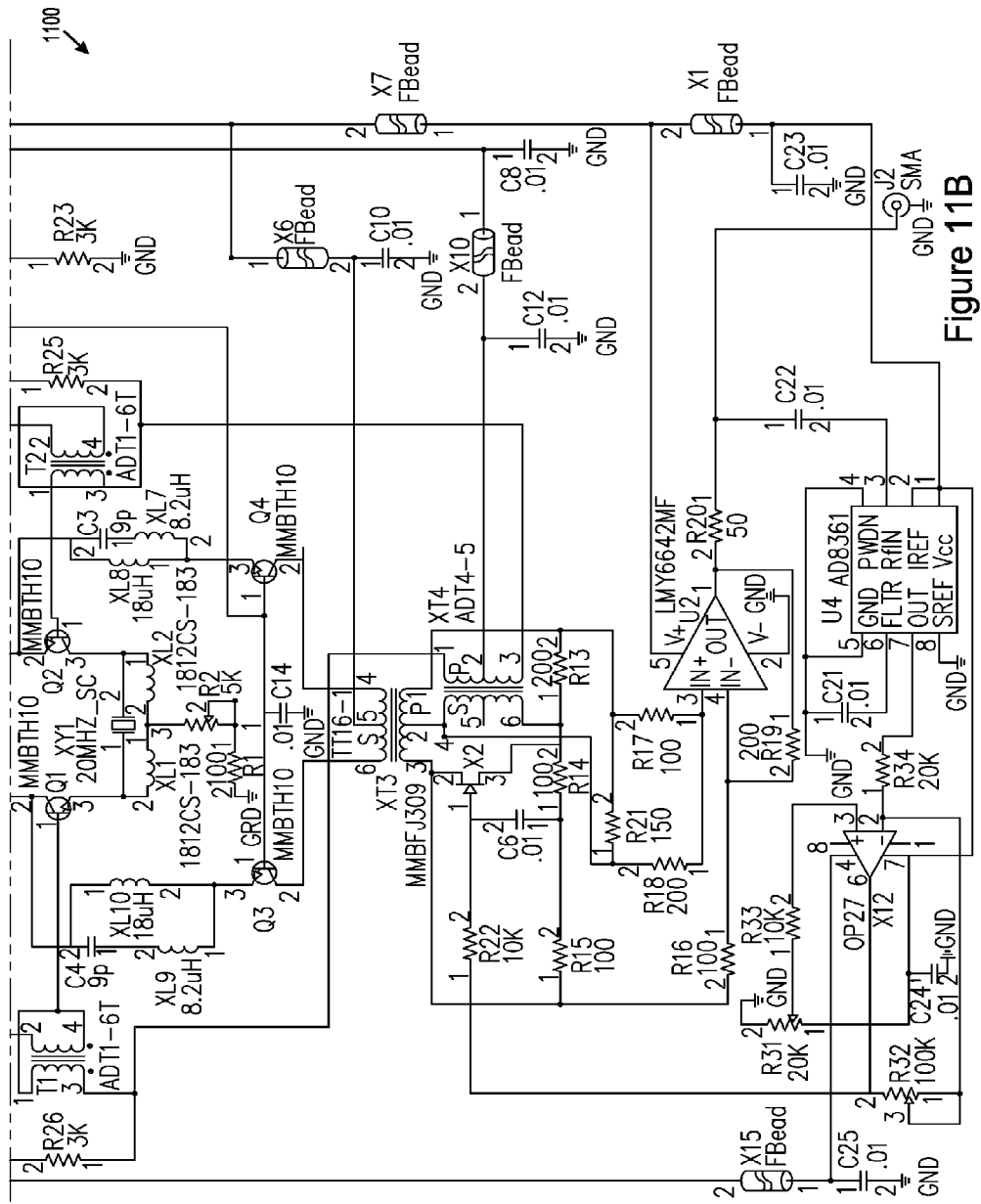

FIGS. 11A and 11B show a diagram 1100 of another embodiment of the dual-mode differential Driscoll circuit. The feedback network may be implemented via a 30 dB-isolation hybrid RF-style combiner. As in the previous embodiment, the balanced, differential configuration used throughout allows bias drifts to be common-mode, increases the output signal power for a given supply voltage, and provides differential outputs for follow-on active mixers. The overall topology may be designed to facilitate monolithic implementation. Differential DC potential may be shunted out at the crystal to improve long-term drifts due to DC-induced piezoelectric stress, and transformer coupling may be used extensively to decrease circuit-generated noise and suppress undesired audio-frequency gain in the oscillator loop. A bridge feedback network may be used, which allows a single junction gate field-effect transistor (JFET) with approximately 50% AC feedback to effect linear amplitude leveling of the loop. Further, high-bandwidth buffer amplifiers may be used to eliminate load pulling of the oscillator.

Additionally, a bias resistance string may be provided for first-order temperature compensation of the bias currents. Inter-stage series traps may also be included to provide proper crystal mode selection, permit required DC bias paths, reduce RF out-of-band gain, and suppress spurious oscillation modes in each loop.

The embodiment may further include transistors Q2, Q3, Q10, and Q11 to form differential cascodes to reduce parametric capacitance swings in the first stages, thus reducing nonlinear mixing (which may result in low-frequency noise) in the front-end gain stages. Ferrite beads X1 through X12, may be included at multiple points in the circuit to provide signal isolation between stages, suppress VHF parasitics caused by cross-coupling in common bias paths, and increase overall stability.

Alternatively, dual-balanced JFET differential pairs or other balanced AGC devices may be provided in the oscillator, particularly in chip processes incorporating ion-implanted JFETs as well as bipolar transistors. Other implementations of gain-control devices may include, for example, bipolar and MOS transistors, pulse-width modulated switches, photocells, phototransistors, diodes, analog multipliers, analog dividers, and digital circuitry involving analog-to-digital ("A/D") and digital-to-analog ("D/A") converters.

Increased phase stability, both long- and short-term, can be obtained by controlling the actual oscillator loop gain (or excess gain). The first or second stage in the loop may be gain-controlled to provide a temperature-, power supply-, and drift-compensated overall oscillation loop gain control to reduce phase variations and amplitude-to-phase conversion effects in the loop. While the first or second stage is discussed, any other place in the loop may be gain-controlled for the same effect. This in turn, in addition to explicit phase control of the loop transfer function, may increase the overall oscillator output-signal frequency and phase stability with time. This may reduce the overall phase noise, both close-in (low-frequency) and wideband.

Figure 12A:
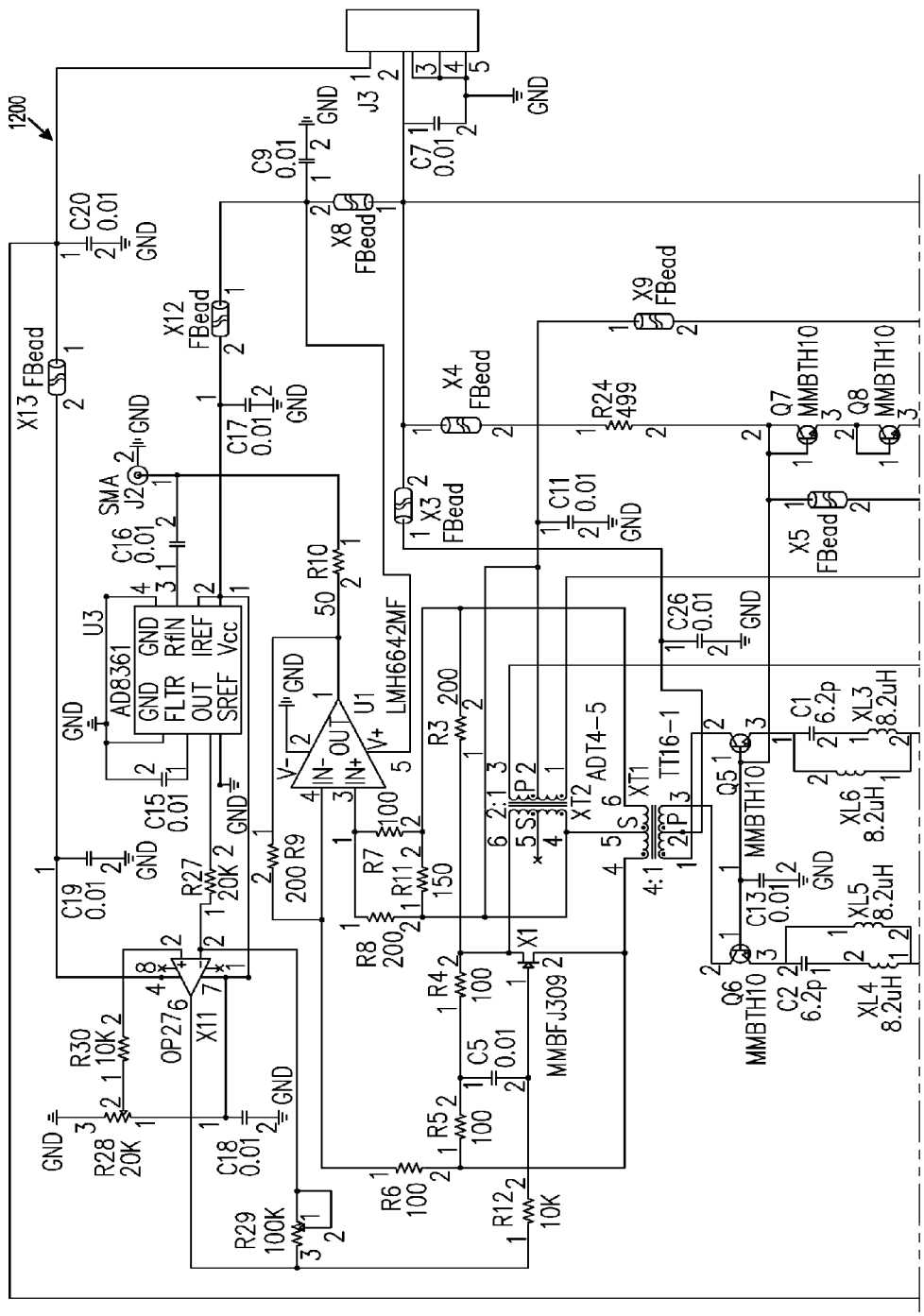
FIGS. 12A and 12B show a diagram of another embodiment of the dual-mode differential Driscoll oscillator circuit
Figure 12B:
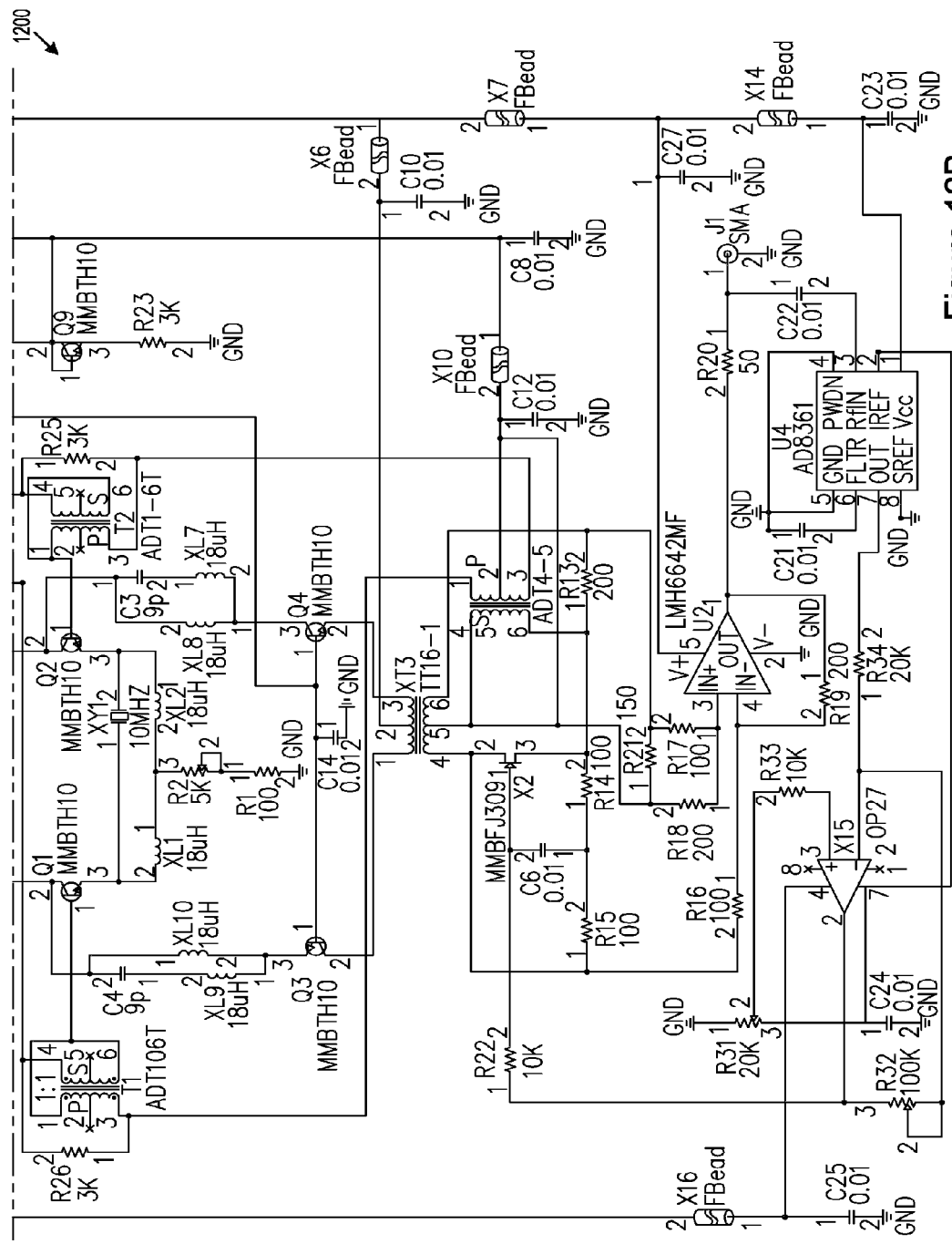

FIGS. 12A and 12B show a diagram 1200 of another embodiment of the dual-mode differential Driscoll oscillator circuit. In this embodiment, the circuit topology may be made substantially fully differential to make the circuit amenable to monolithic implementation while making bias drifts common-mode, increasing the output signal level for low supply voltages, and reducing even-order distortion in the gain loops. A linear gain-control mechanism may be used to reduce mixing in the amplitude-limiting circuitry, and hybrid RF combiners may be used to preserve isolation between the $C_3$- and $B_5$-mode feedback loops. Any combination of the features described above for a dual-mode differential Driscoll oscillator may reduce phase noise below 10 Hz for long-term stability, where the narrow crystal bandpass (e.g., $Q>10^6$) may not provide filtering of circuit-contributed noise and drift effects.

A transformer-coupled bridge circuit using a single JFET with approximately 50% AC feedback from drain to gate as a variable resistor to control the degree of imbalance may be provided to implement a linear, low-distortion, low-noise, precisely balanced attenuator. Since the JFET is operated with zero DC bias current, there are no added shot or surface noise components to degrade the output signal. This circuit thus operates as an electronically adjustable differential attenuator which is configured to exhibit significant noise contributions from only one active device, plus small additions from the fixed resistors in the bridge. Further, the electronically variable differential attenuator circuit is effectively composed of only linear circuit elements.

The crystal itself may be placed between the emitters of a bipolar differential pair, which may form the initial gain stage for both oscillator gain loops.

In this embodiment, DC-bypassed series resonant circuits, for example, C1, XL3, and XL6, may be provided for crystal oscillation mode selection and spurious rejection. These circuits may be placed between the collectors of the differential pairs and the emitters of the cascade gain stage which follows. In order to reduce frequency pulling, these circuits may use temperature-compensating components and may operate at the minimum Q required for reliable mode selection and spurious suppression. XT1, X1, R3, R4, R5, and C5 may be provided to form a voltage-variable bridge circuit between the drain of X1 and the secondary center-tap of XT1. When X1 is pinched off, the bridge may be balanced and voltage across the primary of XT2 may be zero. Conversely, when X1 conducts, the bridge may be unbalanced and drive may be supplied to the primary of XT2. The secondary of XT2 may provide balanced differential feedback drive and DC bias through the hybrid combiner to transistors Q1 and Q2. Amplifier U1 may also be provided to output gain drive and differential-to-single-ended conversion, while U3, X11, and X1 may be provided to form the amplitude-detection and leveling-loop circuitry. This functionality may be correspondingly mirrored in the $C_3$ gain loop. This is a preferred implementation of an electronic AGC circuit including a balanced bridge network to regulate circuit gain, where the bridge includes a JFET transistor or other single-ended gain-control device to regulate gain while maintaining approximate balance in the bridge.

This form of balanced attenuator circuit is also useful for general analog signal processing applications in addition to the differential oscillator described above.

While various embodiments of the disclosure have been described, it will be apparent to those of ordinary skill in the art that many more embodiments and implementations are possible within the scope of the disclosure. Accordingly, the disclosure is not to be restricted except in light of the attached claims and their equivalents.

What is claimed is:

1. A dual-polyhedral oscillator array, comprising:
   an outer sensing array of oscillators, comprising:
      a first pair of sensing oscillators situated along a first axis of the outer sensing array,
      a second pair of sensing oscillators situated along a second axis of the outer sensing array, and
      a third pair of sensing oscillators situated along a third axis of the outer sensing array; and
   an inner clock array of oscillators situated inside the outer sensing array, comprising:
      a first pair of clock oscillators situated along a first axis of the inner clock array,
      a second pair of clock oscillators situated along a second axis of the inner clock array, and
      a third pair of clock oscillators situated along a third axis of the inner clock array.

2. The dual-polyhedral oscillator of claim 1, wherein:
   each of the first pair of sensing oscillators is situated on opposite sides of the first axis of the outer sensing array;
   each of the second pair of sensing oscillators is situated on opposite sides of the second axis of the outer sensing array;
   each of the third pair of sensing oscillators is situated on opposite sides of the third axis of the outer sensing array;
   each of the first pair of clock oscillators is situated on opposite sides of the first axis of the inner clock array;
   each of the second pair of clock oscillators is situated on opposite sides of the second axis of the inner clock array; and
   each of the third pair of clock oscillators is situated on opposite sides of the third axis of the inner clock array.

3. The dual-polyhedral oscillator array of claim 1, further comprising a master oscillator coupled to the first pair of clock oscillators, the second pair of clock oscillators and the third pair of clock oscillators.

4. The dual-polyhedral oscillator array of claim 1,
   wherein the first pair of clock oscillators, the second pair of clock oscillators and the third pair of clock oscillators comprise low-gamma oscillators; and
   wherein the first pair of sensing oscillators, the second pair of sensing oscillators, and the third pair of sensing oscillators comprise high-gamma oscillators.

5. The dual-polyhedral oscillator array of claim 1, wherein the first pair of clock oscillators, the second pair of clock oscillators, the third pair of clock oscillators, the first pair of sensing oscillators, the second pair of sensing oscillators, and the third pair of sensing oscillators comprise dual-mode oscillators.

6. The dual-polyhedral oscillator array of claim 1, wherein the outer sensing array and the inner clock array each comprises a cubic array.

* * * * *

UNITED STATES PATENT AND TRADEMARK OFFICE
CERTIFICATE OF CORRECTION

PATENT NO. : 8,686,804 B2  
APPLICATION NO. : 13/745438  
DATED : April 1, 2014  
INVENTOR(S) : Stephen Fulton Smith et al.

It is certified that error appears in the above-identified patent and that said Letters Patent is hereby corrected as shown below:

On the Title Page

Left column, item (71), replace "UT-Batelle," with --UT-Battelle,--.

Signed and Sealed this  
Seventh Day of October, 2014

Michelle K. Lee  
*Deputy Director of the United States Patent and Trademark Office*